(12) United States Patent
Penumatcha et al.

(10) Patent No.: US 12,310,101 B2
(45) Date of Patent: May 20, 2025

(54) GATE DIELECTRICS FOR COMPLEMENTARY METAL OXIDE SEMICONDUCTORS TRANSISTORS AND METHODS OF FABRICATION

(71) Applicant: Intel Corporation, Santa Clara, CA (US)

(72) Inventors: Ashish Verma Penumatcha, Beaverton, OR (US); Seung Hoon Sung, Portland, OR (US); Jack Kavalieros, Portland, OR (US); Uygar Avci, Portland, OR (US); Tristan Tronic, Aloha, OR (US); Shriram Shivaraman, Hillsboro, OR (US); Devin Merrill, McMinnville, OR (US); Tobias Brown-Heft, Portland, OR (US); Kirby Maxey, Hillsboro, OR (US); Matthew Metz, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 997 days.

(21) Appl. No.: 17/133,208

(22) Filed: Dec. 23, 2020

(65) Prior Publication Data

US 2022/0199619 A1 Jun. 23, 2022

(51) Int. Cl.
*H10D 84/85* (2025.01)
*H10B 61/00* (2023.01)
(Continued)

(52) U.S. Cl.
CPC ............. *H10D 84/85* (2025.01); *H10B 61/22* (2023.02); *H10B 63/30* (2023.02); *H10N 50/01* (2023.02);
(Continued)

(58) Field of Classification Search
CPC ........... H01L 27/092; H01L 21/823857; H01L 27/0924; H01L 21/823821; H01L 29/517;
(Continued)

(56) References Cited

U.S. PATENT DOCUMENTS 6,670,248 B1 12/2003 Ang et al.
8,859,371 B2 10/2014 Song et al.
(Continued)

FOREIGN PATENT DOCUMENTS

CN 104347507 B * 7/2017 ......... H01L 21/8238

OTHER PUBLICATIONS

Ahadi, Kaveh, "High-k Complex Oxides for Advanced Gate Dielectric Applications Grown by Atomic Layer Deposition", Department of Chemical and Materials Engineering, University of Alberta, 2016, 97 pgs.
(Continued)

*Primary Examiner* — Shahed Ahmed
(74) *Attorney, Agent, or Firm* — Essential Patents Group, LLP

(57) ABSTRACT

A complementary metal oxide semiconductor (CMOS) transistor includes a first transistor with a first gate dielectric layer above a first channel, where the first gate dielectric layer includes $Hf_{1-x}Z_xO_2$, where $0.33<x<0.5$. The first transistor further includes a first gate electrode on the first gate dielectric layer and a first source region and a first drain region on opposite sides of the first gate electrode. The CMOS transistor further includes a second transistor adjacent to the first transistor. The second transistor includes a second gate dielectric layer above a second channel, where the second gate dielectric layer includes $Hf_{1-x}Z_xO_2$, where $0.5<x<0.99$, a second gate electrode on the second gate dielectric layer and a second source region and a second drain region on opposite sides of the second gate electrode.

13 Claims, 18 Drawing Sheets

(51) Int. Cl.
*H10B 63/00* (2023.01)
*H10N 50/01* (2023.01)
*H10N 50/10* (2023.01)
*H10N 50/80* (2023.01)
*H10N 70/00* (2023.01)
*H10N 70/20* (2023.01)

(52) U.S. Cl.
CPC ............. *H10N 50/10* (2023.02); *H10N 50/80* (2023.02); *H10N 70/011* (2023.02); *H10N 70/253* (2023.02); *H10N 70/841* (2023.02); *H10N 70/8833* (2023.02)

(58) Field of Classification Search
CPC ..... H01L 21/28158–28238; H01L 29/51–518; H01L 21/02142–02161; H01L 21/82385; H01L 29/792–7926; H10B 61/22; H10B 63/30; H10N 50/01; H10N 50/10; H10N 50/80; H10N 70/011; H10N 70/253; H10N 70/841; H10N 70/8833; H10D 84/85; H10D 64/519; H10D 30/721; H10D 64/691; H10D 64/693
See application file for complete search history.

(56) References Cited

U.S. PATENT DOCUMENTS

| | | | |
|---|---|---|---|
| 2006/0001106 A1 | 1/2006 | Metz et al. | |
| 2007/0040227 A1 | 2/2007 | Datta et al. | |
| 2008/0230854 A1* | 9/2008 | Clark | H01L 21/28202 257/E29.345 |
| 2012/0309144 A1* | 12/2012 | Do | H01L 21/823857 257/E21.639 |
| 2014/0110791 A1 | 4/2014 | Clark | |
| 2016/0099046 A1* | 4/2016 | Liran | G11C 11/417 623/6.63 |
| 2020/0098879 A1* | 3/2020 | Lee | H01L 29/66287 |
| 2020/0127111 A1* | 4/2020 | Lin | H01L 29/4966 |
| 2021/0167182 A1 | 6/2021 | Sung et al. | |
| 2021/0408229 A1* | 12/2021 | More | H01L 29/4236 |
| 2023/0213597 A1* | 7/2023 | Timopheev | G01R 33/098 324/252 |
| 2024/0032309 A1* | 1/2024 | Chiang | H10N 70/841 |

OTHER PUBLICATIONS

Clark, Robert D., "Emerging Applications for High K Materials in VLSI Technology", Materials 2014, 7, 2913-2944, 32 pgs.

Haddara, Yaser M. et al., "22. Silicon-Germanium: Properties, Growth and Applications", Springer Handbook of Electronic and Photonic Materials, 2017, 19 pgs.

Hueting, Raymond J., "The Balancing Act in Ferroelectric Transistors: How Hard Can It Be?", Micromachines 2018, 9, 582, 14 pgs.

Robertson, John et al., "High-K materials and metal gates for CMOS applications", Materials Science and Engineering R 88, 2015, 41 pgs.

Xie, Junan et al., "Research Progress of High Dielectric Constant Zirconia-Based Materials for Gate Dielectric Application", Coatings 2020, 10, 698, 16 pgs.

Extended European Search Report from European Patent Application No. 21210312.1 notified May 9, 2022, 13 pgs.

Chiang, Chen-Kuo, et al., "Characterization of Hf1-xZrxO2 Gate Dielectrics with $0 \leq x \leq 1$ Prepared by Atomic Layer Deposition for Metal Oxide Semiconductor Field Effect Transistor Applications", Japanese Journal of Applied Physics 51 (2012) 011101, 6 pgs.

* cited by examiner

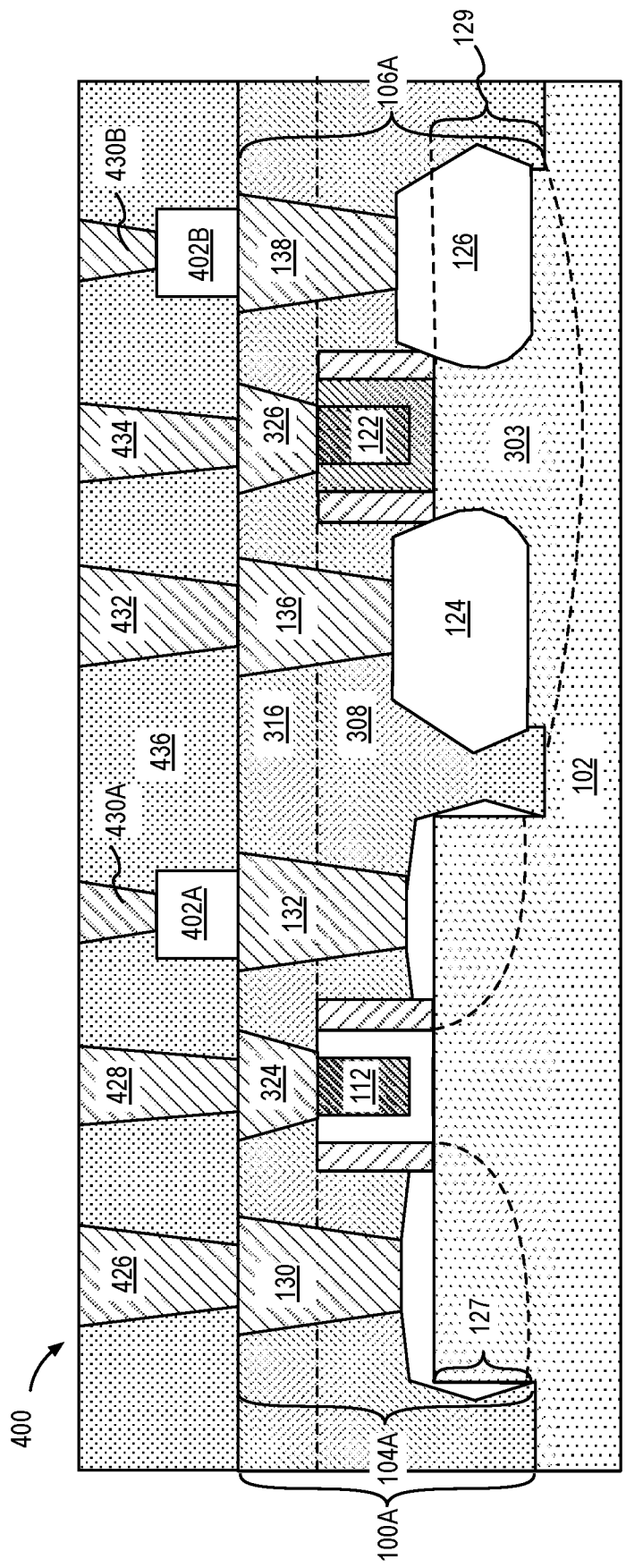
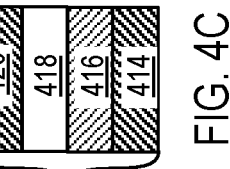
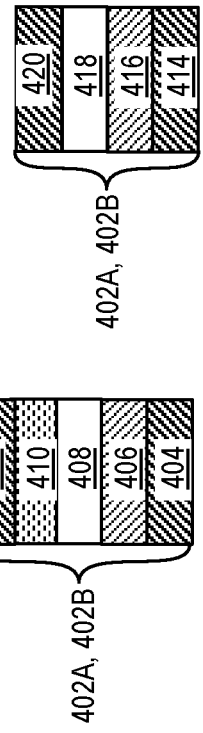
FIG. 4A
FIG. 4B
FIG. 4C

GATE DIELECTRICS FOR COMPLEMENTARY METAL OXIDE SEMICONDUCTORS TRANSISTORS AND METHODS OF FABRICATION

BACKGROUND

Generally, complementary metal-oxide semiconductor (CMOS) transistors are the foundation of modern electronics. High performance CMOS transistors used for switching in microprocessors utilize gate dielectric materials having a high dielectric constant. Typically, CMOS transistors include NMOS and PMOS transistors having substantially the same gate dielectric material. However, a same gate dielectric material can adversely affect device performance such as reliability in one MOS transistor over another. Therefore, there is a need for CMOS transistors to have gate dielectric materials that do not lead to MOS specific performance degradation. It is with respect to these and other considerations that the present improvements are needed. Such improvements may become critical as the desire for improved transistor performance becomes more widespread with device scaling.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 4A is a cross-sectional illustration of a memory device coupled with an NMOS transistor and a substantially identical memory device coupled with an adjacent PMOS transistor, in accordance with an embodiment of the present disclosure.

FIG. 4B is a cross-sectional illustration of a magnetic tunnel junction device, in accordance with an embodiment of the present disclosure.

FIG. 4C is a cross-sectional illustration of a resistive random-access memory device, in accordance with an embodiment of the present disclosure.

DESCRIPTION OF THE EMBODIMENTS

Figure 1A:
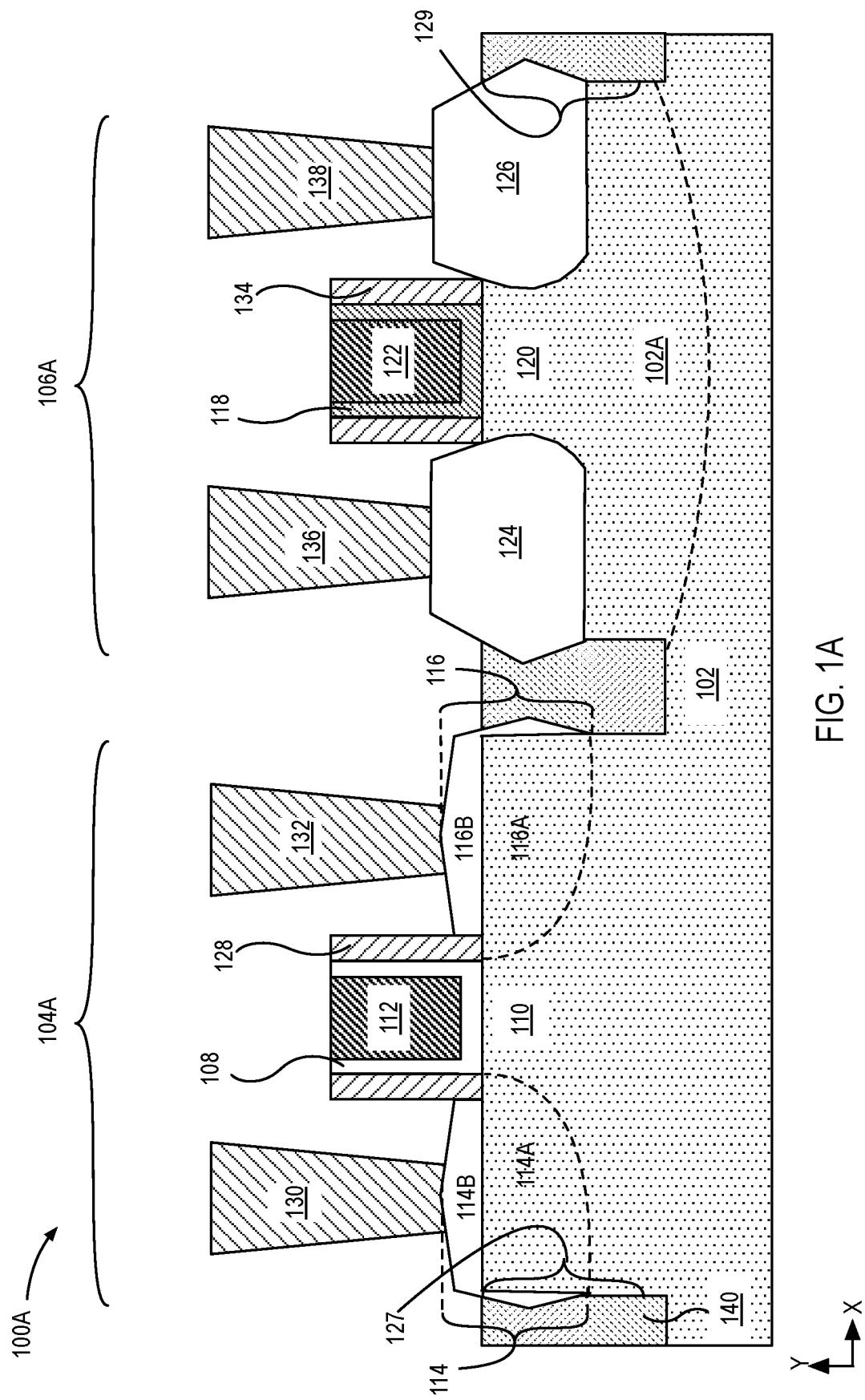
FIG. 1A is a cross sectional illustration of a CMOS transistor including an NMOS transistor having a first gate dielectric layer adjacent to a PMOS transistor having a second gate dielectric layer, in accordance with an embodiment of the present disclosure.

Gate dielectrics for CMOS transistors and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with CMOS transistors, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

To enable feature size scaling in silicon channels, gate dielectric layers having a higher dielectric constant (high-K) than silicon have been implemented in a variety of CMOS transistor architectures such as planar transistor, fin-field effect transistor (fin-FET), nanowire and stacked nanowire transistor. High-K gate dielectric layers have been implemented to overcome limitations of gate oxide thickness scaling, such as low inversion charge and high gate leakage of conventional silicon-oxide based gate dielectric materials. Implementation of High-K gate dielectric layers has led to transistors with lower leakage current and lower power dissipation with a same capacitance compared to a traditional silicon oxide gate oxide.

As PMOS and NMOS transistors operate on different charge transport mechanisms, tuning resultant shifts in threshold voltage, $V_T$, between NMOS and PMOS transistors is typically performed by implementing gate electrode materials having different work functions. Typically gate dielectric layer includes a same material in both NMOS and PMOS transistors. As CMOS transistors have scaled down to sub 10 nm gate lengths, scaling in high-K gate dielectric layer thickness can adversely impact reliability. For example, NMOS transistors are more prone to dielectric breakdown compared to a PMOS counterpart, with gate dielectric thickness scaling. Thus, it is highly desirable to tune a material of the gate dielectric for each MOS transistor independently to address reliability and threshold voltage tuning concerns.

In accordance with an embodiment of the present disclosure, the inventors have found that implementing a different high-K gate dielectric in NMOS and PMOS transistors can help address reliability and $V_T$ shifts. In exemplary embodiments, the high-K gate dielectric layer includes Hf, Zr and O having different concentrations of Zr between the two MOS implementations. In other embodiments, the Hf, Zr and O in the high-K gate dielectric layer may be supplanted with different dopants for each MOS over. In some embodiments, the addition of these dopants can also preferentially change the crystallinity and thus impacting the high-K characteristic of the two different gate dielectric layers.

In embodiments, the two high-K gate dielectric layers can have different thicknesses to address gate oxide breakdown separately. In other embodiments, an additional layer of a gate dielectric layer may be inserted between one or both of the two high-K gate dielectric layers and their respective semiconductor channel material. In some embodiments, the additional gate dielectric layer may be another high K gate dielectric layer or a layer of silicon oxide.

Different high-K gate dielectric materials in NMOS and PMOS transistors, may be facilitated by a gate last fabrication approach where the gate dielectric layer and gate electrode for each MOS type can be deposited at two different points in the process flow.

FIG. 1A is a cross-sectional illustration of a CMOS transistor 100A. The CMOS transistor 100A includes a transistor 104A adjacent to a transistor 106B. Transistors 104A and 106A are NMOS and PMOS transistor pairs, where transistor 104A is an NMOS transistor and transistor 106A is a PMOS transistor 106A or vice versa. The substrate 102 may be N or P type. In the illustrative embodiment, transistor 104A is an NMOS transistor 104A and transistor 106A is a PMOS transistor. Transistors 104A and 106A may have a planar or non-planar architecture. As such, channel layers of each transistor 104A and 106A may have a gate on at least one sidewall in addition to a top surface of each channel layer.

In the illustrative embodiment, transistor 104A includes a gate dielectric layer 108 above a channel 110 of a substrate 102. In the illustrative embodiment, substrate 102 is P-type. In an exemplary embodiment, gate dielectric layer 108 includes $Hf_{1-x}Zr_xO_2$, where 0.33<x<0.5. The transistor 104A further includes a gate electrode 112 adjacent to the gate dielectric layer 108 and a source region 114 and a drain region 116 on opposite sides of the gate electrode 112.

As shown, transistor 106A includes a gate dielectric layer 118 above a channel 120. The channel 120 is within a n-well 102A (within dashed lines) or the substrate 102. In an exemplary embodiment, the gate dielectric layer 118 includes $Hf_{1-x}Zr_xO_2$, where 0.5<x<0.99. The transistor 106A further includes a gate electrode 122 adjacent to the gate dielectric layer 118, and a source region 124 and a drain region 126 on opposite sides of the gate electrode 118.

$Hf_{1-x}Zr_xO_2$ gate dielectric layers 108 and 118 have smaller and more uniform grains and more uniform film quality than $HfO_2$ and exhibit good thermal stability with silicon channels 110 and 120, respectively. Gate dielectric layer 108 and 118 including $Hf_{1-x}Zr_xO_2$ also advantageously facilitate higher drive current by increasing number of carriers at given overdrive $V_G$-$V_T$, compared to gate dielectric layers 108 and 118 including only $HfO_2$, where $V_G$ is a gate voltage and $V_T$ is a threshold voltage.

The atomic percentage of Zr in the $Hf_{1-x}Zr_xO_2$ also affects the crystallinity in gate dielectric layers 108 and 118. In embodiments, gate dielectric layer 108 including $Hf_{1-x}Zr_xO_2$ where, 0.33<x<0.5 is associated with a monoclinic phase, whereas gate dielectric layer 108 including $Hf_{1-x}Zr_xO_2$, where 0.5<x<0.75 is associated with a tetragonal or orthorhombic phase. The tetragonal phase may increase the dielectric constant of $Hf_{1-x}Zr_xO_2$ gate dielectric layers 108 and 118 compared to a monoclinic phase.

In some embodiments, the gate dielectric layer 108 includes dopants such as but not limited to of La, Y or Sr. The dopant concentration can vary with dopant material, but in embodiments, dopant concentration is less than 5 atomic percent. In embodiments, the gate dielectric layer 118 includes dopants such as but not limited to Al or Nb. The dopant concentration can vary with dopant material, but in embodiments, dopants concentration is less than 5 atomic percent. Dopants create charged dipoles which can shift $V_T$, providing an additional knob to tune $V_T$, and lessen reliance on work-function engineering of gate electrode material. For, example, in $Hf_{1-x}Zr_xO_2$, because the atomic percent of Zr is substantially greater than an atomic percentage of the dopants, $V_T$ is not impacted significantly when small quantities of dopants are added to shift $V_T$. The presence of dopants does not appreciably change the thickness of the gate dielectric layer 108 or 118.

In some embodiments, a gate dielectric layer 118, includes HfO$_2$. In some such embodiments, the gate dielectric layer 118 includes dopants example Al, Si, Gd & Y. Dopants such as Al, Si, Gd & Y may stabilize higher-k phase when added to HfO$_2$.

Figure 1B:
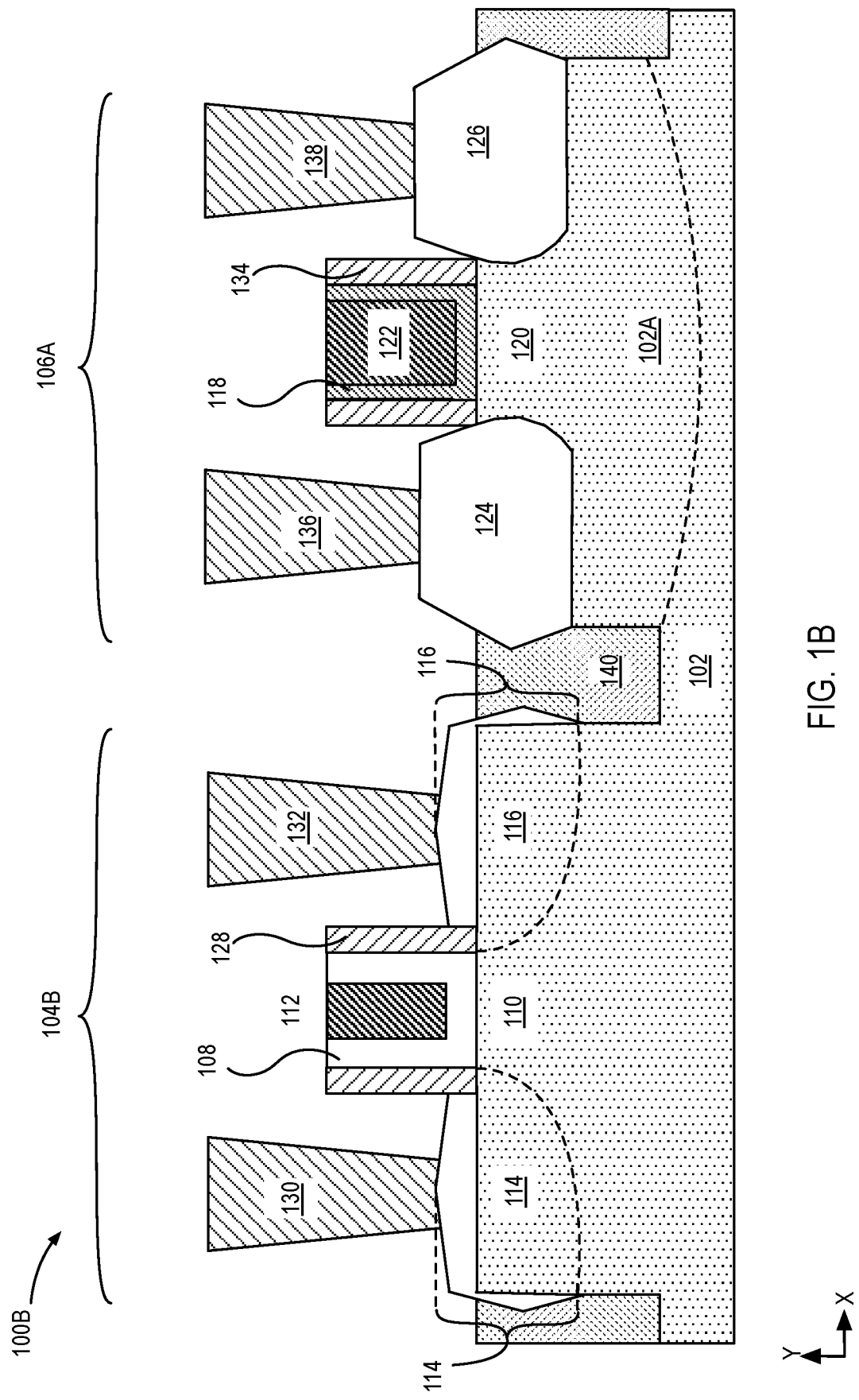
FIG. 1B is a cross sectional illustration of a CMOS transistor including an NMOS transistor having a first gate dielectric layer adjacent to a PMOS transistor having a second gate dielectric layer, in accordance with an embodiment of the present disclosure.

In some embodiments, gate dielectric layer 108 can be thicker than gate dielectric layer 118 by at least 0.2 nm, such as is illustrated in transistor 104B of CMOS transistor 100B in FIG. 1B. Transistor 106A is the same or substantially the same as the transistor 106A in CMOS transistor 100A.

Figure 1C:
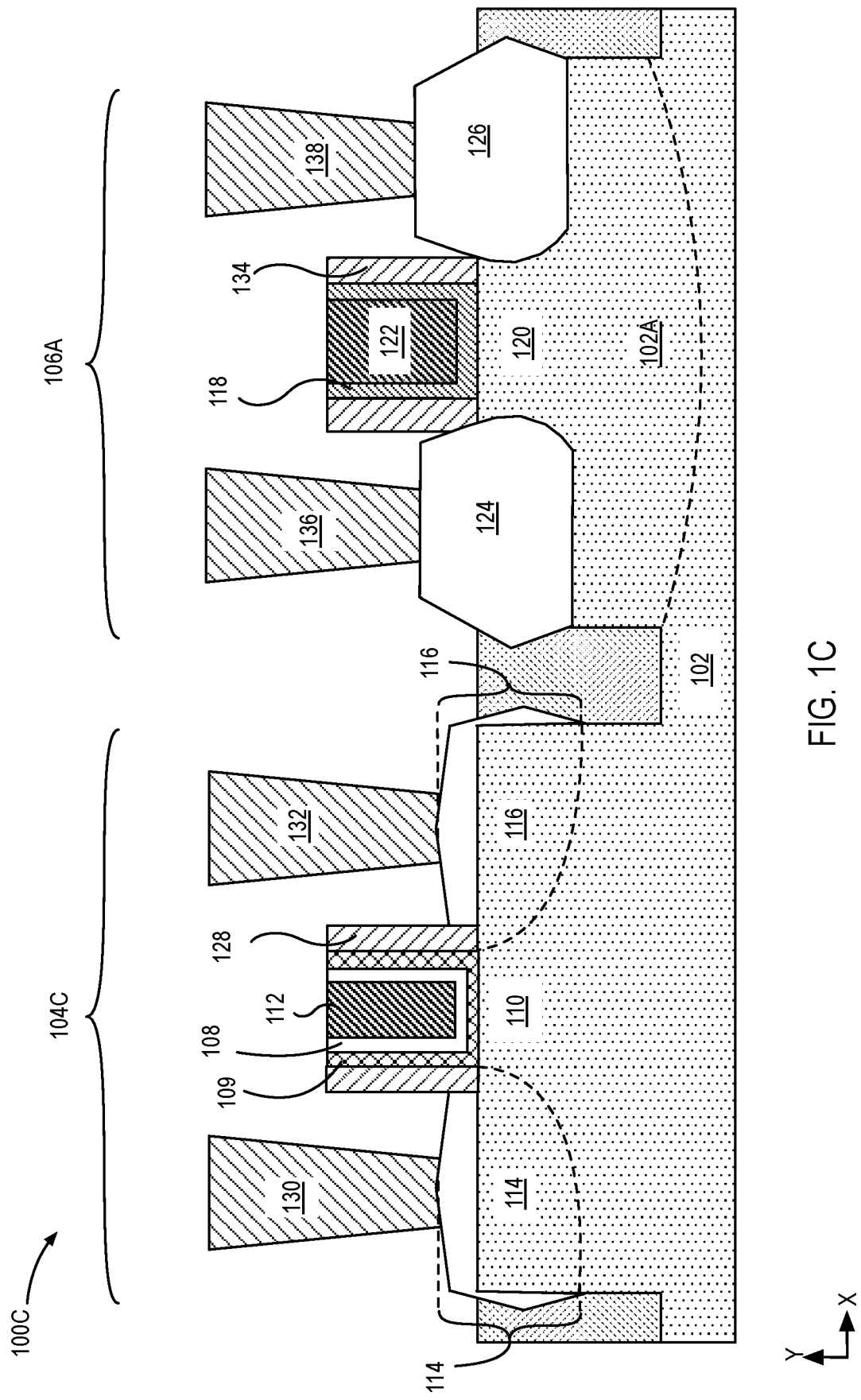
FIG. 1C is a cross sectional illustration of a CMOS transistor including an NMOS transistor having a first gate dielectric layer on a third gate dielectric layer, adjacent to a PMOS transistor having a second gate dielectric layer, in accordance with an embodiment of the present disclosure.

In other embodiments, transistor 104 further includes an additional high-K gate dielectric layer between channel 110 and gate dielectric layer 108 as illustrated in transistor 104C of CMOS transistor 100C in FIG. 1C. The CMOS transistor 100C includes a transistor 104C and transistor 106A. As shown, while transistor 104C includes an additional gate dielectric layer 109, whereas transistor 106A does not include an additional gate dielectric layer. The gate dielectric layer 109 advantageously provides an added barrier to block electrons through to the gate electrode 112. As such material of gate dielectric layer 109 has a higher conduction band offset compared to the material of gate dielectric layer 108. In some embodiments, gate dielectric layer 109 includes oxygen and one or more of aluminum, lanthanum or yttrium.

To provide a sufficiently thin a total electrical oxide thickness, the gate dielectric layer 109 has a thickness that is between 0.5 nm and 1 nm. In some embodiments, gate dielectric layer 109 has thickness between 0.7 nm and 1 nm, and the gate dielectric layer 108 has a thickness of at least 1.3 nm. In embodiments, the gate dielectric layer 118 is sufficiently thick and has a crystallinity that provides sufficient barrier again the electrons in channel 120, in an absence of an additional gate dielectric layer such as gate dielectric layer 109.

Figure 1D:
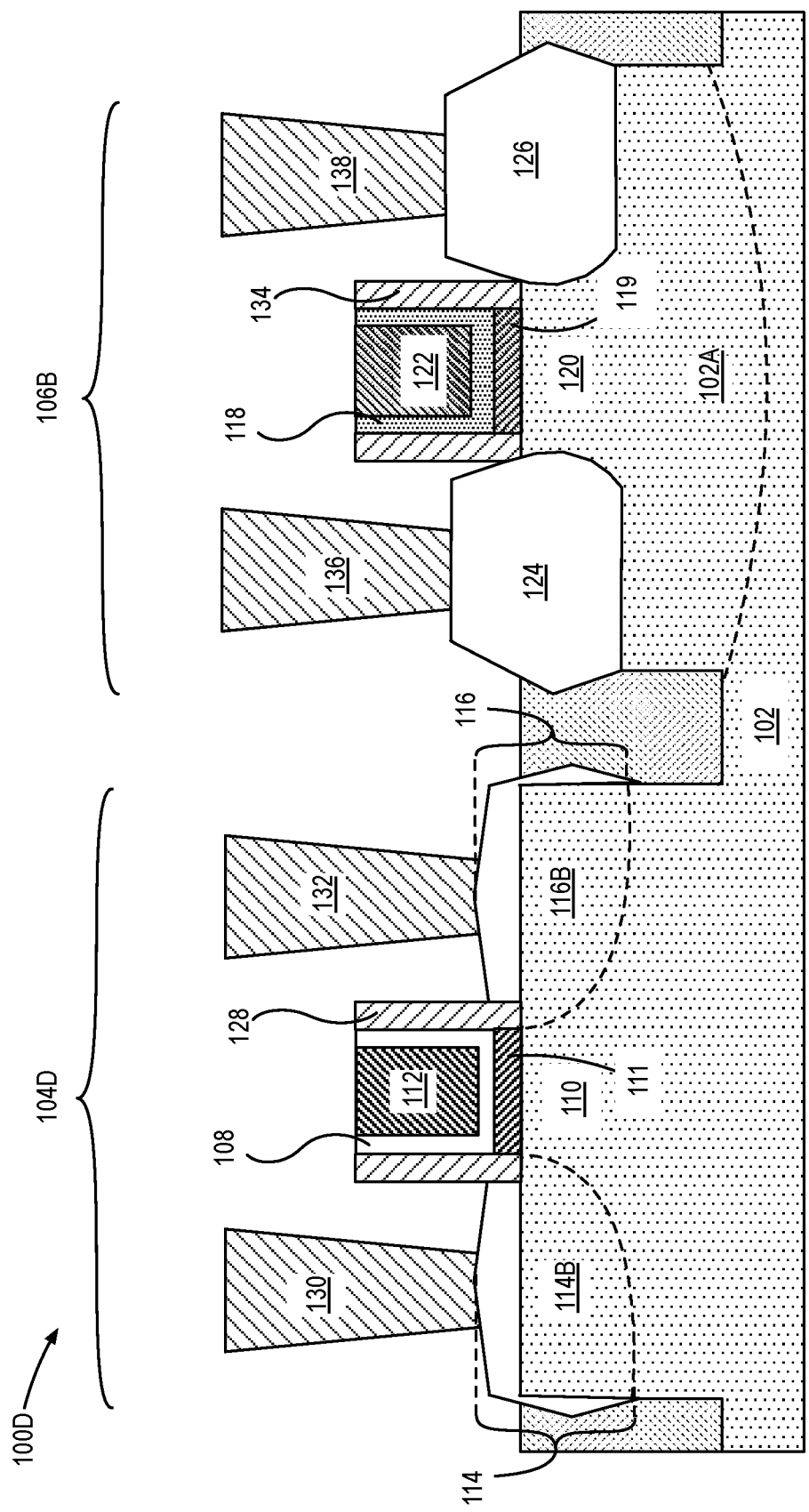
FIG. 1D is a cross sectional illustration of a CMOS transistor including an NMOS transistor having a first gate dielectric layer on a gate dielectric layer including silicon oxide adjacent to a PMOS transistor having a second gate dielectric layer adjacent to a gate dielectric including silicon oxide, in accordance with an embodiment of the present disclosure.

In yet another embodiment, transistors 104D and 106B of CMOS transistor 100D can each include an additional gate dielectric between the respective channels 110 and 120 and gate dielectric layers 108 and 118, as illustrated in FIG. 1D. In the illustrative embodiment, transistor 104D further includes a gate dielectric layer 111 between channel 110 and gate dielectric layer 108, and transistor 106B further includes a gate dielectric layer 119 between channel 120 and gate dielectric layer 118.

In the illustrative embodiment, the gate dielectric layer 108 is adjacent to sidewalls of dielectric spacer 128 and extends up to an uppermost surface of the gate electrode 112, whereas gate dielectric layer 111 is adjacent to a portion of the dielectric spacer 128 but does not extend to an uppermost surface of the gate electrode 128. Similarly, the gate dielectric layer 119 is adjacent to sidewalls of dielectric spacer 134 and extends up to an uppermost surface of the gate electrode 122, whereas gate dielectric layer 119 is adjacent to a portion of the dielectric spacer 134 but does not extend to an uppermost surface of the gate electrode 122. As such, the gate dielectric layers 111 and 119 are limited in spatial extent to a respective interface between the channels 110 and 120 and the gate dielectric layers 108 and 118.

In some examples, gate dielectric layers 111 and 119 may be an artifact of one or more fabrication operations. In other embodiments, gate dielectric layers 111 and 119 are intentionally implemented. In embodiments, gate dielectric layer 111 and 119 each include silicon and oxygen. The gate dielectric layers 111 and 119 may have a same or substantially same thickness or different thicknesses. In an exemplary embodiment, the gate dielectric layer 111 has a thickness that is greater than a thickness of the gate dielectric layer 119 by at least 0.1 nm.

Referring again to Figure TA, gate dielectric layers 108 and 118 may include a material other than Hf$_{1-x}$Zr$_x$O$_2$ as described above. In some embodiments, the gate dielectric layers 108 and 118 may each include Hf and Zr doped with silicon. In exemplary embodiments, the silicon dopant has a concentration between 1 to 3 atomic percent. The dopant concentration may be different in gate dielectric layers 108 and 118. In further embodiments, gate dielectric layer 108 includes Hf, Zr, Si and one of La, Y or Sr, where La, Y or Sr has a concentration of less than 5 atomic percent. In other embodiments gate dielectric layer 118 includes Hf, Zr, Si and one of Al or Nb, where Al or Nb has a concentration of less than 5 atomic percent.

In embodiments, the gate electrode 112 and 122 can each include different materials. In an embodiment, gate electrode 112 includes a work function layer in contact with the gate dielectric layer 108 and a fill metal above the work function layer. In some embodiments, the work function layer in contact with the gate dielectric layer 108 includes an elemental layer, a metal alloy layer or a laminate structure of either or both. In some embodiments, the work function layer includes one or more of hafnium, zirconium, titanium, tantalum, aluminum, or carbon, or carbon and one or more of hafnium, zirconium, titanium, tantalum, aluminum. In some embodiments, the fill metal may include ta or tungsten.

In an embodiment, gate electrode 122 includes a work function layer in contact with the gate dielectric layer 118 and a fill metal above the work function layer. In some embodiments, the work function layer in contact with the gate dielectric layer 118 includes an elemental layer, a metal alloy layer or a laminate structure of either or both. In some embodiments, the work function layer includes one or more of ruthenium, palladium, platinum, cobalt, nickel or titanium nitride.

In the illustrative embodiment, CMOS transistors 100A, 100B, 100C and 100D are examples of non-planar transistors. As shown, transistor 104A includes a fin structure 127 and transistor 106A includes fin structure 129. In an embodiment, the fin structure 127 includes the source region 114 and drain region 116 and channel 110. As shown source region 114 further includes doped epitaxial structure 114B on a doped region 114A of the fin 127. As shown drain region 116 further include doped epitaxial structure 116B on a doped region 116A of the fin 127. In embodiments fin 127 includes single crystal silicon, and doped regions 114A and 116A include n-type source drain dopants such as arsenic or phosphorus. Transistors 104B, 104C and 104D each have features of the fin 127, source region 114 and drain region 116 and channel 110 of transistor 104A.

Transistor 104 further includes a dielectric spacer 128 adjacent to the gate dielectric layer 108, a source contact 130 in contact with epitaxial structure 114B, and a drain contact 132 in contact with epitaxial structure 116B.

In the illustrative embodiment, the fin structure 129 includes the source region 124 and drain region 126 and channel 120. As shown source region 124 is a doped epitaxial structure on a portion of the fin 129. As shown drain region 126 further include doped epitaxial structure on a portion of the fin 129. In embodiments when fin 129 includes single crystal silicon and doped epitaxial structures each include p-type source drain dopants such as boron or gallium.

Transistor 106A further includes dielectric spacer 134 adjacent to the gate dielectric layer 118, a source contact 136 in contact with source region 124, and a drain contact 138 in contact with drain region 126. In embodiments source contacts 130 and 136 and drain contacts 132 and 138, each include a same material. In embodiments, the source contacts 130 and 136 and drain contacts 132 and 138 include a metal liner including for example, tantalum or ruthenium and a fill metal on the liner including, for example, tungsten, ruthenium, copper, nickel or molybdenum. Transistor 106B has features of the fin 129, source region 124 and drain region 126 and channel 120 of transistor 106A.

As shown, CMOS transistor 100A further includes dielectric material 140 adjacent to the fin structures 127 and 129. Dielectric 140 includes a material that provides electrical isolation. In embodiments, dielectric 140 includes silicon and one or more of carbon, nitrogen and oxygen.

While CMOS transistors 100A-D are examples of fin-FET transistors, tuning threshold voltage is further advantageous in nanowire transistors, where spacing between vertically stacked nanowires present challenges for insertion of gate electrode material.

Figure 1E:
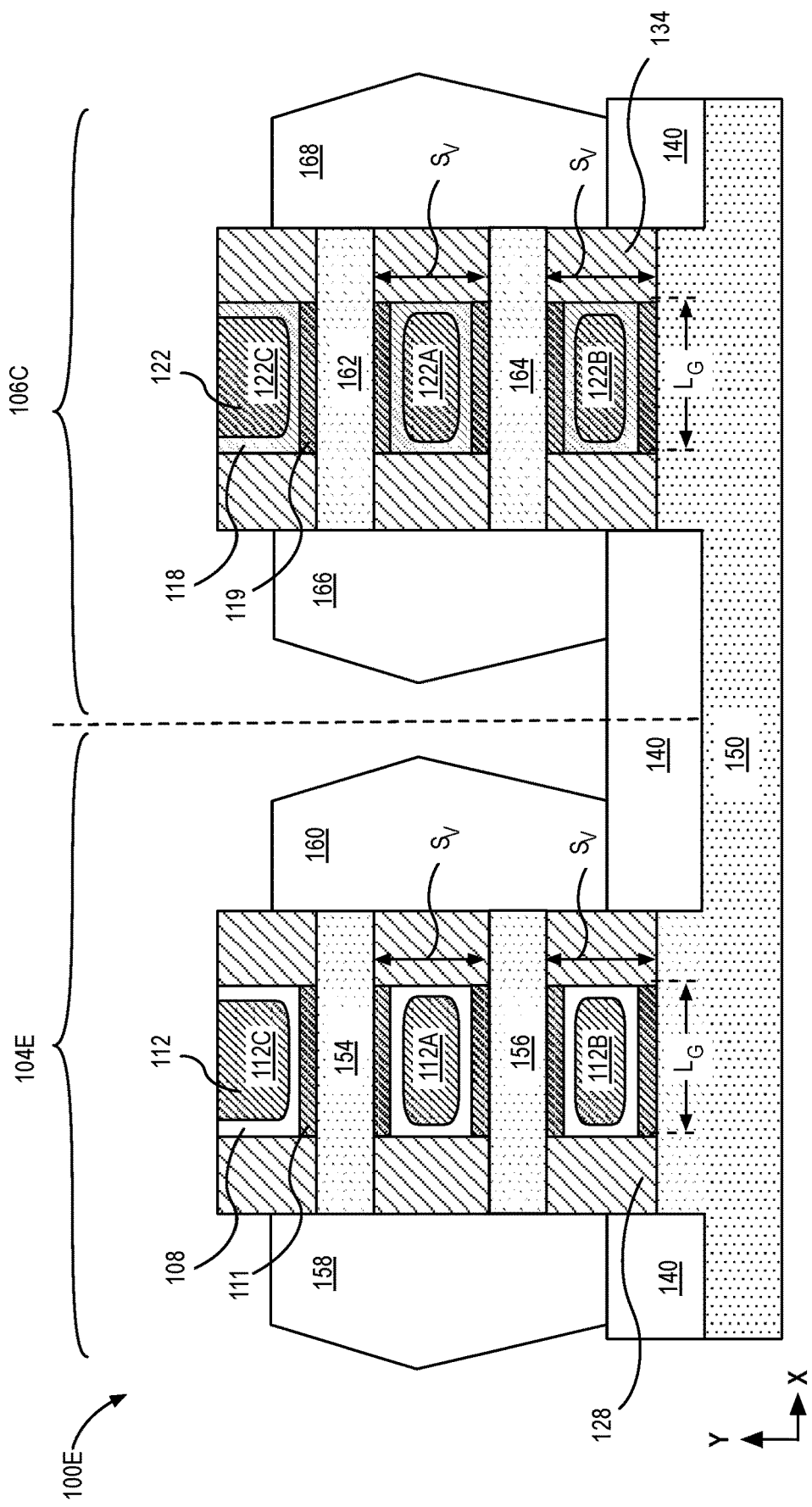
FIG. 1E is a cross sectional illustration of a CMOS transistor including an NMOS transistor including a plurality of nanowires adjacent to a PMOS transistor including a plurality of nanowires, in accordance with an embodiment of the present disclosure.

FIG. 1E is a cross-sectional illustration of a CMOS transistor 100E above a substrate 150. The CMOS transistor 100E includes an NMOS transistor 104E adjacent to a PMOS transistor 106C, in accordance with an embodiment of the present disclosure. Transistors 104E and 106C are examples of nanowire transistors.

The transistor 104E includes a channel layer 154 over a channel layer 156, where the channel layer 154 and channel layer 156 include monocrystalline silicon. The transistor 104E further includes epitaxial source material 158 (herein source epi 158) coupled to a first end of the channel layer 154 and channel layer 156 and a epitaxial drain material 160 (herein drain epi 160) coupled to a second end of the channel layer 154 and channel layer 156, as shown. A gate electrode 112 is between the source contact 158 and the drain contact 160. The gate electrode 112 is between the channel layer 154 and channel layer 156 and around the channel layer 154 and channel layer 156. The transistor 104E further includes a plurality of gate dielectric layers. As shown, the transistor 104E includes a gate dielectric layer 111 and a gate dielectric layer 108. In the illustrative embodiment, gate dielectric layer 111 is between the gate electrode 112 and channel layer 154 and channel layer 156, and gate dielectric layer 108 is between the gate dielectric layer 111 and the gate electrode 112.

Transistor 104E has one or more features of transistor 104D, where gate dielectric layer 111 is directly adjacent to the channel, and gate dielectric layer 108 is between the gate dielectric layer 111 and gate electrode 112. In the illustrative embodiment, gate electrode 112 has gate electrode portion 112A between channels 154 and 156, a gate electrode portion 112B (below channel layer 156) and a gate electrode portion 112C (above channel layer 154).

Figure 1F:
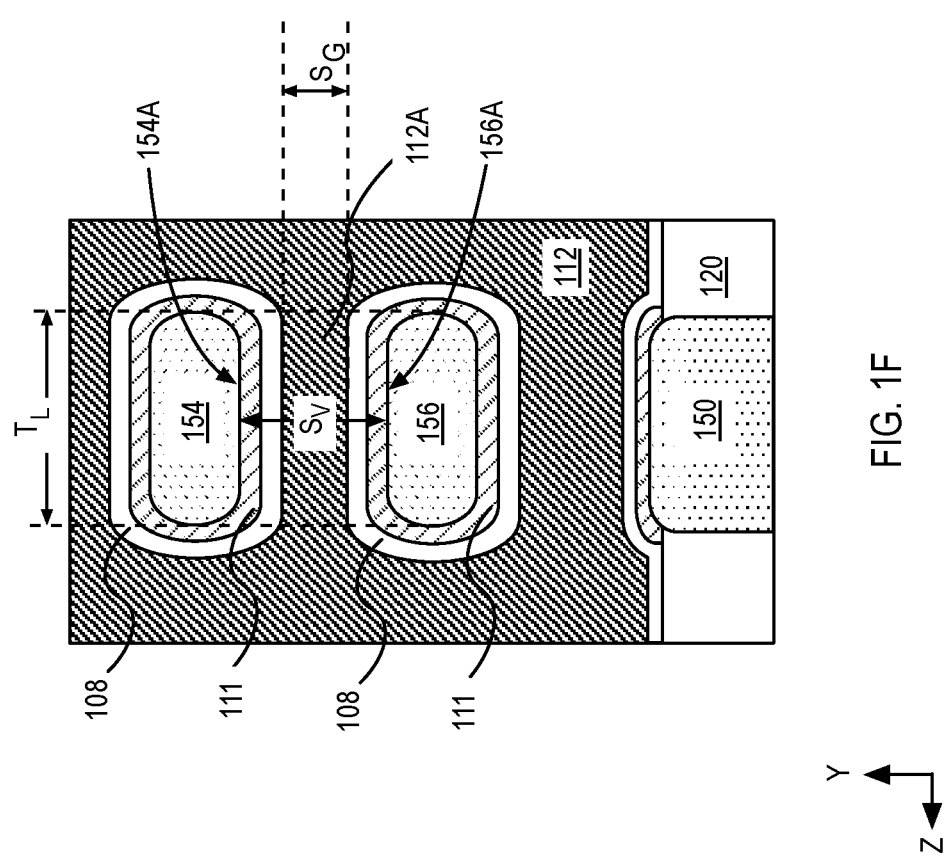
FIG. 1F is a cross-sectional illustration taken along a line A-A' of the structure in FIG. 1E.

The presence of gate dielectric layers 108 and 111 are advantageous for applications in nanowire architecture because of the limited spacing, $S_V$, between channel layers 154 and 156. In some embodiments, $S_V$ is less than 10 nm. FIG. 1F is a cross sectional illustration through a line A-A', of the structure in FIG. 1E. In the illustrative embodiment, channel layer 154 and channel layer 156 are rectangular with rounded corners. In other embodiments channel layer 154 and channel layer 156 have a substantially rectangular profile. In the illustrative embodiment, gate dielectric layer 111 clads channel layer 154 and channel layer 156. In the illustrative embodiment, the gate dielectric layers 108 is substantially conformal with the gate dielectric layer 111. Gate electrode portion 112A has a vertical thickness, $S_G$ (along the y-direction). In the illustrative embodiment, $S_G$, is the spacing between the gate dielectric layer 108 adjacent to lowermost surface 154A the gate dielectric layer 108 adjacent to uppermost surface 156A.

As shown, $S_G$, correlates inversely with a combined thickness of the gate dielectric layers 108 and 111 for a given $S_V$. In embodiments, where $S_V$ is less than 10 nm, and where gate dielectric layers 108 and 111 have a combined thickness that is less than 2 nm, the spacing between channel layers 154 and 156 for gate electrode portion 112A is less than 6 nm. In some exemplary embodiments, $S_G$, is approximately 3 nm.

In an embodiment, the gate electrode 112 includes one or more layers, where a first layer in contact with the gate dielectric layer 108 is a work function electrode and a second layer in contact with the first is a fill metal. Depending on $S_V$, some gate electrode portions such as gate electrode portion 112A (between channels 154 and 156) and gate electrode portion 112B (below channel layer 156) may only include a work function electrode, while gate electrode portion 112C may include a work function electrode and a fill metal. As shown, a top surface of gate electrode portion 112C is not bounded by gate dielectric layers 111 or 108.

In embodiments, $S_V$ cannot be increased arbitrarily because of large aspect ratio patterning required during the fabrication process. In some such embodiments, it is advantageous for threshold voltage tuning of transistor 104E to be carried out through engineering material choices of the gate dielectric layer 108 rather than tuning with material of gate electrode 112. The gate dielectric 108 has one or more features of the gate dielectric layer 108 described in association with transistors 104A, 104B, 104C and 104D (in FIGS. 1A, 1B, 1C and 1D, respectively) that are advantageous for tuning the threshold voltage of transistor 104E. Referring again to FIG. 1F, in embodiments, the gate dielectric 111 has one or more features of the gate dielectric layer 111 described in association with transistor 104D in FIG. 1D.

Referring again to FIG. 1E, while two channels, such as channel layer 154 and channel layer 156 are shown, in other examples, transistor 104E can include up to 5 channel layers. A larger number of channel layers can increase a drive current of transistor 104E.

In the illustrative embodiment, transistor 106C includes one or more features of transistor 106A such as channel layers, epitaxial source and drain structures. As shown, The transistor 106C includes a channel layer 162 over a channel layer 164, where the channel layer 162 and channel layer 164 include monocrystalline silicon. The transistor 106C further includes epitaxial source material 166 coupled to a first end of the channel layer 162 and channel layer 164, and an epitaxial drain material 168 coupled to a second end of the channel layer 162 and channel layer 164, as shown. A gate electrode 122 is between the epitaxial source material 166 and the epitaxial drain material 168. In the illustrative embodiment, gate electrode 122 has gate electrode portion 122A between channels 162 and 164, a gate electrode portion 122B below channel layer 164 and a gate electrode portion 122C above channel layer 162.

The transistor 106C further includes a plurality of gate dielectric layers. As shown, the transistor 106C includes a gate dielectric layer 119 and a gate dielectric layer 118. In the illustrative embodiment, gate dielectric layer 119 is between the gate electrode 122 and channel layer 162, and between gate electrode 122 and channel layer 164. As shown, gate dielectric layer 118 is between gate dielectric layer 119 and gate electrode 112.

In embodiments, the gate dielectric layer 119 has one or more of the features (such as material composition and thicknesses) associated with gate dielectric layer 119 of transistor 106B and the gate dielectric layer 118 has one or more of the features (such as material composition and thicknesses) associated with gate dielectric layer 118 of transistor 106A and 106B (described in association with FIG. 1A-D). Substrate 150 has one or more features of the substrate 150 associated with substrate 102. In an embodiment, substrate 150 includes monocrystalline silicon.

In the illustrative embodiment, spacer 128 is adjacent to the gate dielectric layer 108 and 111, and between the channel layers 154 and 156 and between channel layer 156 and substrate 150. In embodiments epitaxial structures 158 and 160 include silicon and carbon and epitaxial structures 166 and 168 include silicon and germanium.

Figure 2:
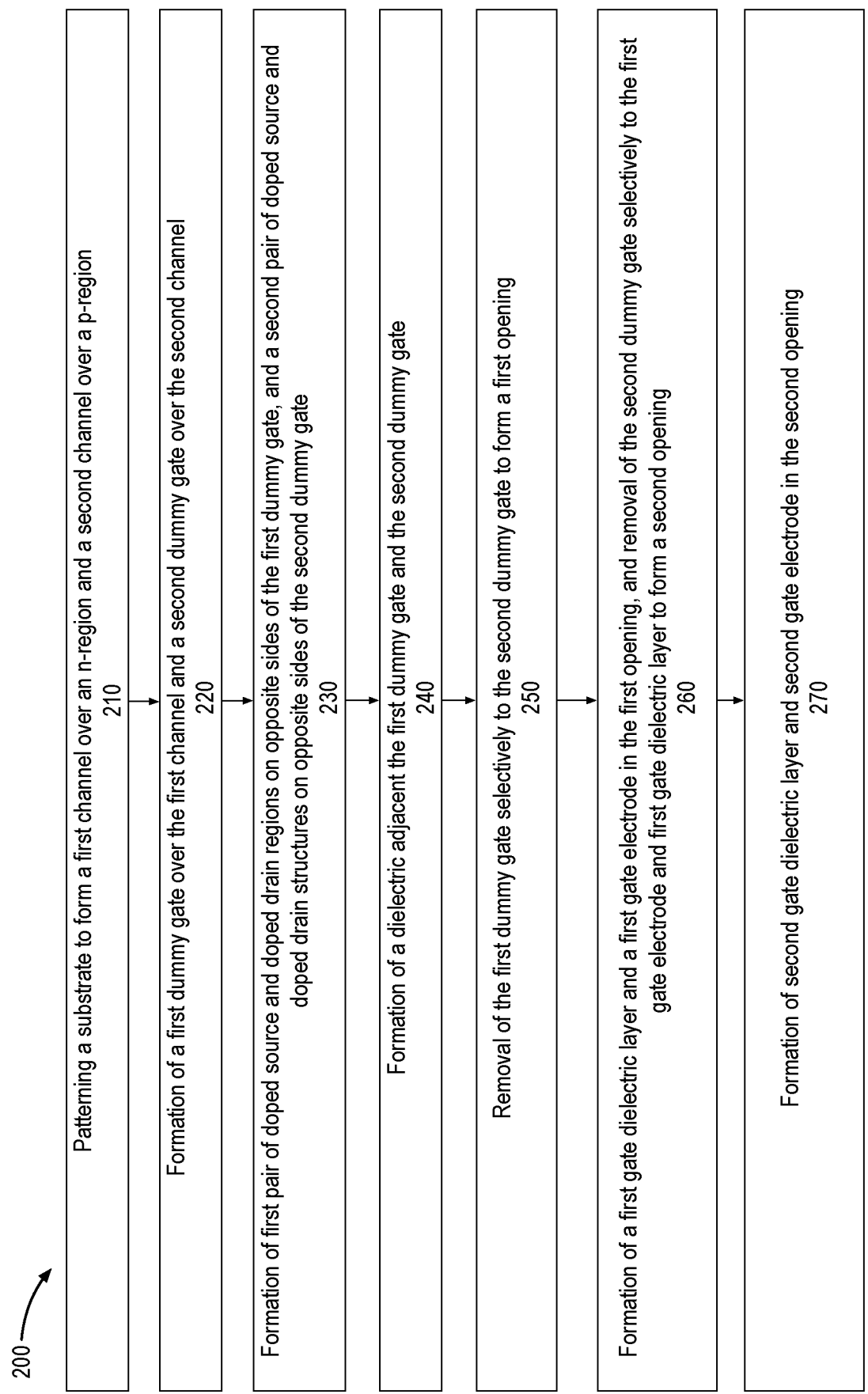
FIG. 2 is a method to fabricate a nanowire transistor such as illustrated in Figure TA, in accordance with an embodiment of the present disclosure.

FIG. 2 is a method 200 to fabricate a transistor such as transistor 100A, in accordance with an embodiment of the present disclosure. The method 200 begins at operation 210 with patterning a substrate to form a first channel over an n-region and a second channel over a p-region. The method 200 continues at operation 220 with the formation of a first dummy gate over the first channel and a second dummy gate over the second channel. The method 200 continues at operation 230 with the formation of first pair of doped source and doped drain regions on opposite sides of the first dummy gate, and a second pair of doped source and doped drain regions on opposite sides of the second dummy gate. The method 200 continues at operation 240 with formation of a dielectric adjacent the first dummy gate and the second dummy gate. The method 200 continues at operation 250 with the removal of the first dummy gate selectively to the second dummy gate to form a first opening. In alternate embodiments, the second dummy gate can be selectively removed with respect to the first dummy gate. The method 200 continues at operation 260 with formation of first gate dielectric layer and a first gate electrode in the first opening and removing the second dummy gate selectively to the first gate electrode and first gate dielectric layer to form a second opening. The method concludes at operation 270 with the formation and forming a second gate dielectric layer and a second gate electrode in the second opening.

Figure 3A:
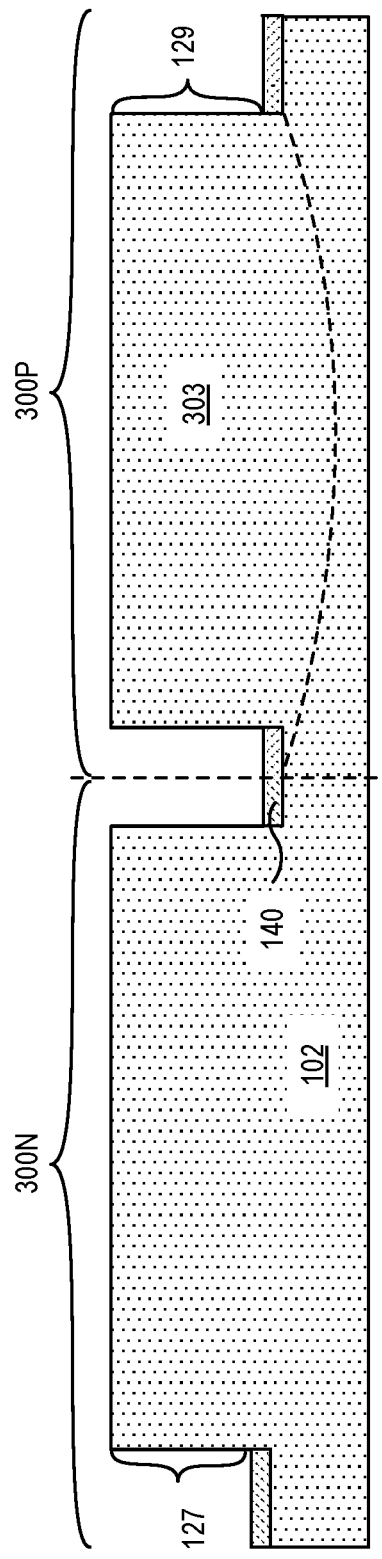
FIG. 3A is a cross-sectional illustration following the formation of a first fin structure in an NMOS region and a second fin structure in a PMOS region, over a substrate.

FIG. 3A illustrates a cross-sectional view of a fin structure 127 and a fin structure 129 patterned in a substrate 102. In an embodiment, a mask is utilized to pattern the substrate 102 to form the fin structures. In an embodiment, fin structures 127 and 129 are formed in portions of the substrate by a plasma etch process. As shown fin structure 127 is in an NMOS region 300N and fin structure 129 is in PMOS region 300P. A dielectric material 140 is deposited adjacent to the fins, and subsequently recessed to form fin structures 127 and 129. In other embodiments, a spacer augmented patterning techniques can be utilized to pattern the fins 127 and 129 to achieve high density fin structures.

In an embodiment, a well region is formed in the substrate 102 in the PMOS region 300P if the substrate 102 is a p-type substrate. As shown, an n-well 303 is formed in PMOS region 300P within a p-type substrate. In some such embodiments, no well is formed in the NMOS-region. Source-drain doping will be performed at a later operation in the n-well region. If the substrate is n-type then, a p-well is formed in the NMOS region 300N. In some embodiments, even if a substrate is p or n type, both n and p-wells can be formed to increase a substrate doping density.

In embodiments, dielectric 140 includes a material that is the same or substantially the same as the material of the dielectric 140 described in association with FIG. 1A.

Figure 3B:
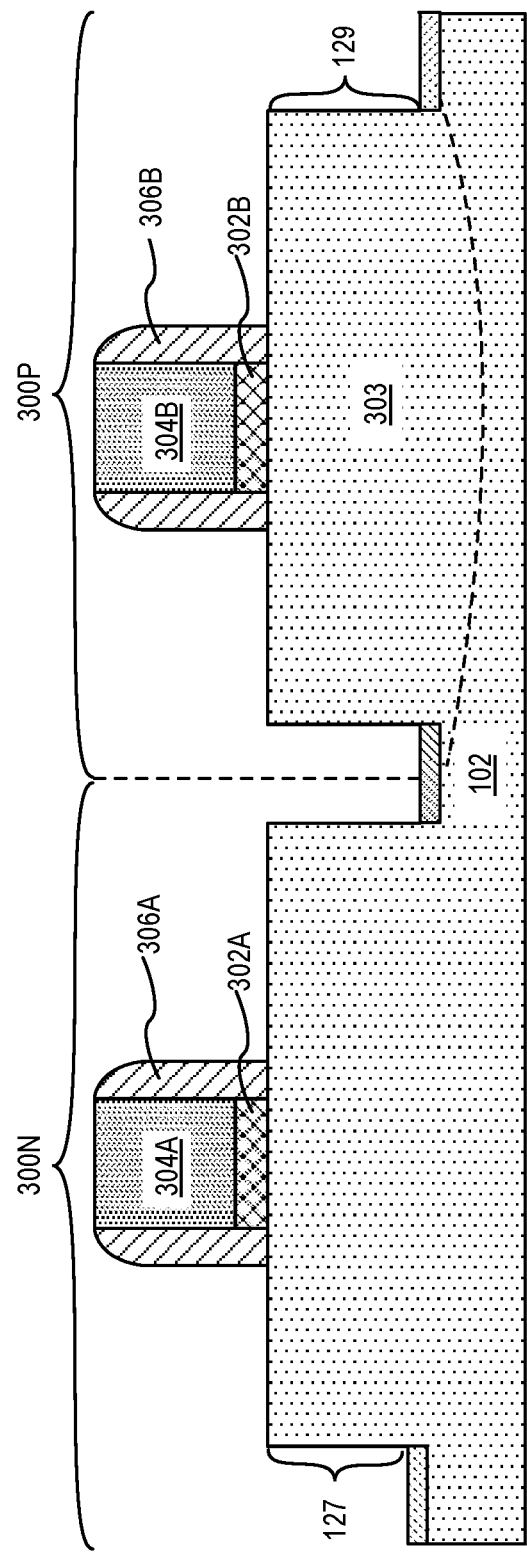
FIG. 3B illustrates the structure of FIG. 3A following the formation of a first dummy gate structure and a first spacer adjacent to the first dummy gate structure and following the formation of a second dummy gate structure and a second spacer adjacent to the second dummy gate structure, in accordance with an embodiment of the present disclosure.

FIG. 3B illustrates the structure of FIG. 3A following the formation of a dummy gate dielectric layer 302A on the fin structure 127, the formation of a dummy gate 304A on the dummy gate dielectric layer 302A, and the formation of dielectric spacer 306A adjacent to the dummy gate dielectric layer 302A and the dummy gate 304A in NMOS region 300N. As shown, dummy gate dielectric layer 302B is formed on the fin structure 129, followed by the formation of a dummy gate 304B on the dummy gate dielectric layer 302B, and the formation of dielectric spacer 306B adjacent to the dummy gate dielectric layer 302B and the dummy gate 304B in PMOS region 300P.

In an embodiment, a dummy gate dielectric layer is deposited on the substrate 102. Subsequently a layer of dummy gate material is deposited on the dummy gate dielectric layer. In an embodiment, the dummy gate dielectric layer includes a layer of material such as but not limited to silicon dioxide or silicon carbide and the dummy gate material includes a layer of material such as a doped polysilicon. In an embodiment, a resist mask is formed on the layer of dummy gate material. In an embodiment, the layer of dummy gate material is then subsequently patterned by a plasma etch process and the dummy gate dielectric layer is patterned using a wet etch process to form dummy gate dielectric layers 302A and 302B and dummy gates 304A and 304B on the dummy gate dielectric layers 302A and 302B, respectively. A dielectric spacer layer is then deposited on the dummy gates 304A and 304B and on each of the fin structures 127 and 129. In an embodiment, the dielectric spacer layer is then patterned using a plasma etch process to form dielectric spacers 306A and 306B adjacent to dummy gates 304A and 304B, respectively as shown in FIG. 3B.

Figure 3C:
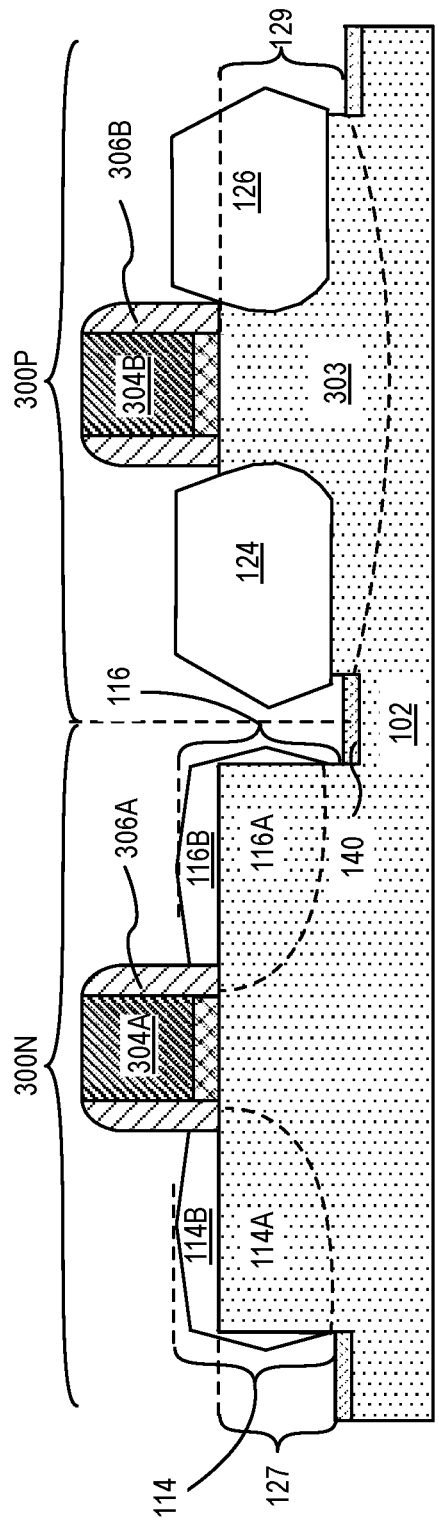
FIG. 3C illustrates a cross-sectional view of the structure of FIG. 3B following the formation of a source region and drain region in NMOS region, and a source structure and drain structure in the PMOS region.

FIG. 3C illustrates a cross-sectional view of the structure of FIG. 3B following the formation of a source region 114 and drain region 116 in NMOS region 300N, a source structure 124 and drain structure 126 in the PMOS region 300P. In an embodiment, the PMOS region 300P is masked and source drain implants are performed to form n-doped regions 114A and 116A of the fin structure 127 in the NMOS region 300N. Doped epitaxial structures 114B and 116B are formed on respective portions 114A and 116A. In one example, doped epitaxial structures 114B and 116B are formed using an epitaxial growth process at process temperatures between 400-600 degrees Celsius. In some examples doped epitaxial structures 114B and 116B include Si and C.

The mask from PMOS region 300P is removed and the NMOS region 300N is then masked. In an embodiment, portions of the exposed fin structure 129 adjacent to dielectric spacer 306B are etched using a plasma etch process to form trenches. In the illustrated example the trench is undercut with respect to dielectric spacer 306B. The trenches may have a height and width chosen to enable subsequent epitaxial formation. In one example, source structure 124 and drain structure 126 are formed using an epitaxial growth process at process temperatures between 400-600 degrees Celsius. The source structure 124 and drain structure 126 include Si and Ge and P-doped. In embodiments, P-dopants include phosphorus and boron.

Figure 3D:
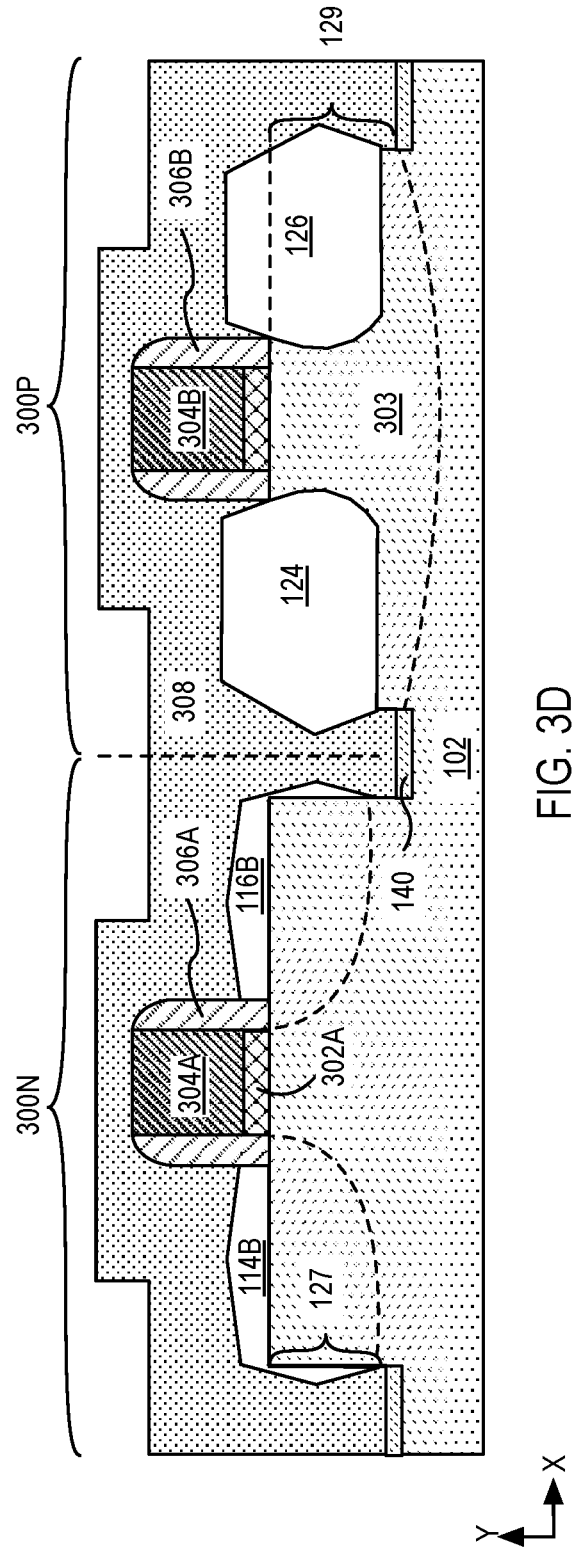
FIG. 3D illustrates the structure of FIG. 3C following the deposition of a first dielectric layer.

FIG. 3D illustrates the structure of FIG. 3C following the deposition of a dielectric layer 308. In an embodiment, dielectric layer 308 is blanket deposited using a chemical vapor deposition (PVD) or a plasma enhanced chemical vapor deposition (PECVD) process and includes a material that is the same or substantially the same as the material of the dielectric layer 140. In an embodiment, the dielectric layer 308 is deposited to a thickness of at least 2.5 times the combined thickness of dummy gate dielectric layer 302A and dummy gate 304A to provide sufficient material for a subsequent planarization process. The dielectric 308 is blanket deposited, as shown, on sidewalls of dielectric spacers 306A and 306B, doped epitaxial structures 114B and 116B, source structure 124 and drain structure 126 and on dielectric 140.

Figure 3E:
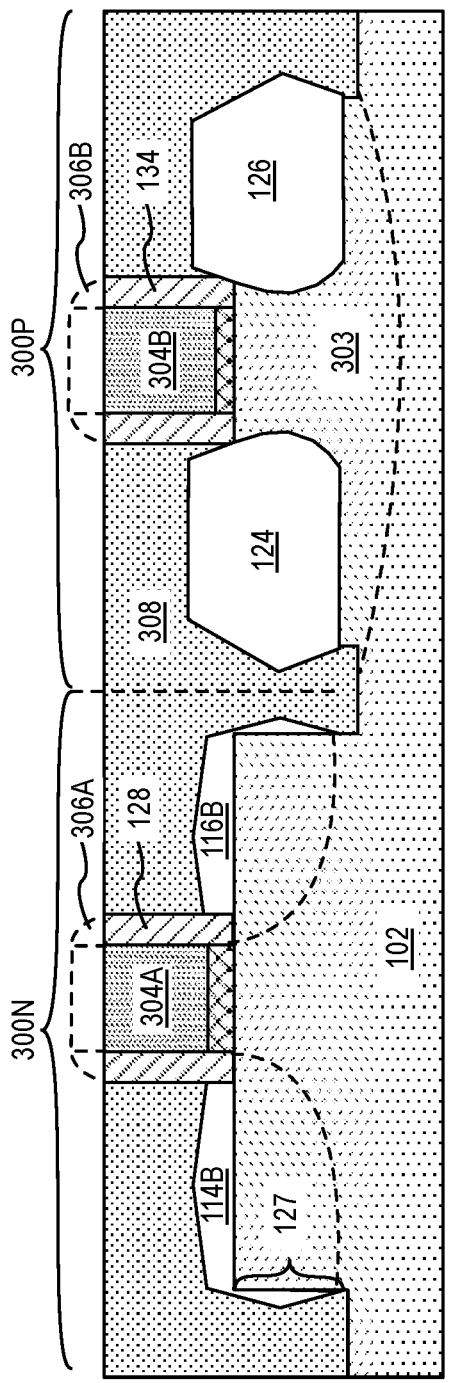
FIG. 3E illustrates the structure of FIG. 3D following planarization of the first dielectric layer, to expose uppermost surfaces of the first and second dummy gate structures.

FIG. 3E illustrates the structure of FIG. 3D following planarization of the dielectric layer 308, upper portions of the dielectric spacers 306A and 306B and upper portions of the dummy gates 304A and 304B. In an embodiment, the planarization process is a chemical mechanical polish (CMP) process. The CMP process is utilized to polish the dielectric layer 308, the upper portions of the dielectric spacers 306A and 306B (dashed lines) and upper portions of the dummy gates 304A and 304B (dashed lines). In one embodiment, the CMP process transforms dielectric spacers 306A and 306B into a dielectric spacers 128 and 134 having substantially flat uppermost dielectric spacer surfaces. Furthermore, in one such embodiment, CMP process results in uppermost surfaces of the dielectric spacers 128 and 134, dummy gates 304A and 304B, and dielectric layer 308 being co-planar or substantially co-planar.

Figure 3F:
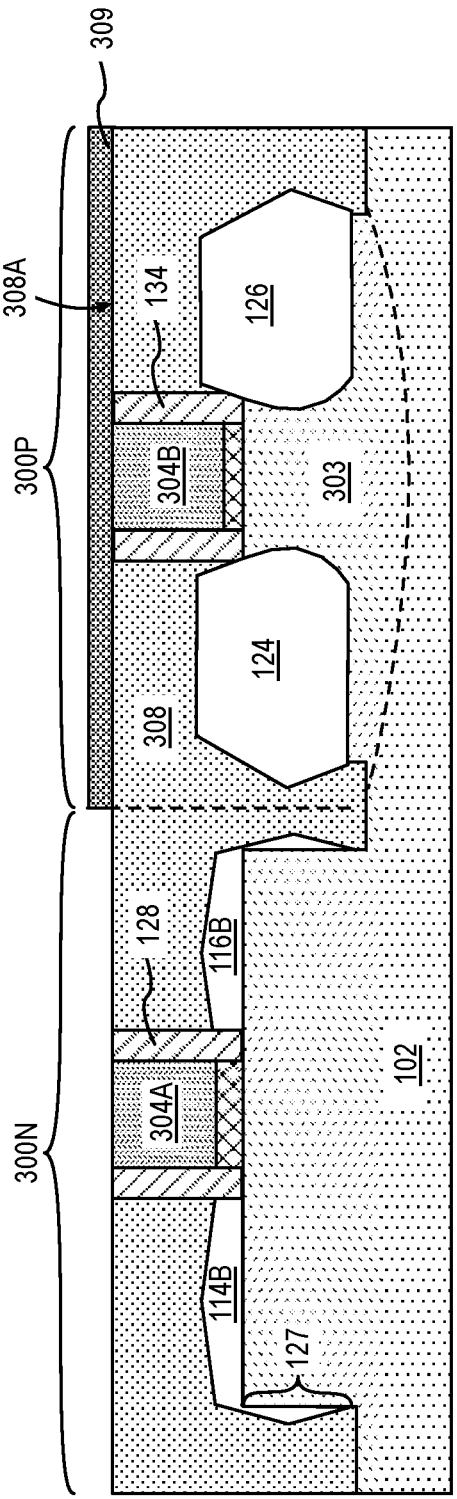
FIG. 3F is a cross-sectional illustration of the structure in FIG. 3E following the process to mask the PMOS region, in accordance with an embodiment of the present disclosure.

FIG. 3F is a cross-sectional illustration of the structure in FIG. 3E following the process to mask PMOS region 300P, in accordance with an embodiment of the present disclosure. Choosing which region to mask depends on limitations imposed by subsequent processing conditions, such as, for example thermal budget for forming gate dielectric layer and gate electrode. In the illustrative embodiment, PMOS region 300P is masked first. In other embodiments, NMOS region 300N is masked first.

In an embodiment, a mask 309 is formed on the PMOS region 300P. The mask 309 may include silicon and one or more of oxygen, carbon or nitrogen.

Figure 3G:
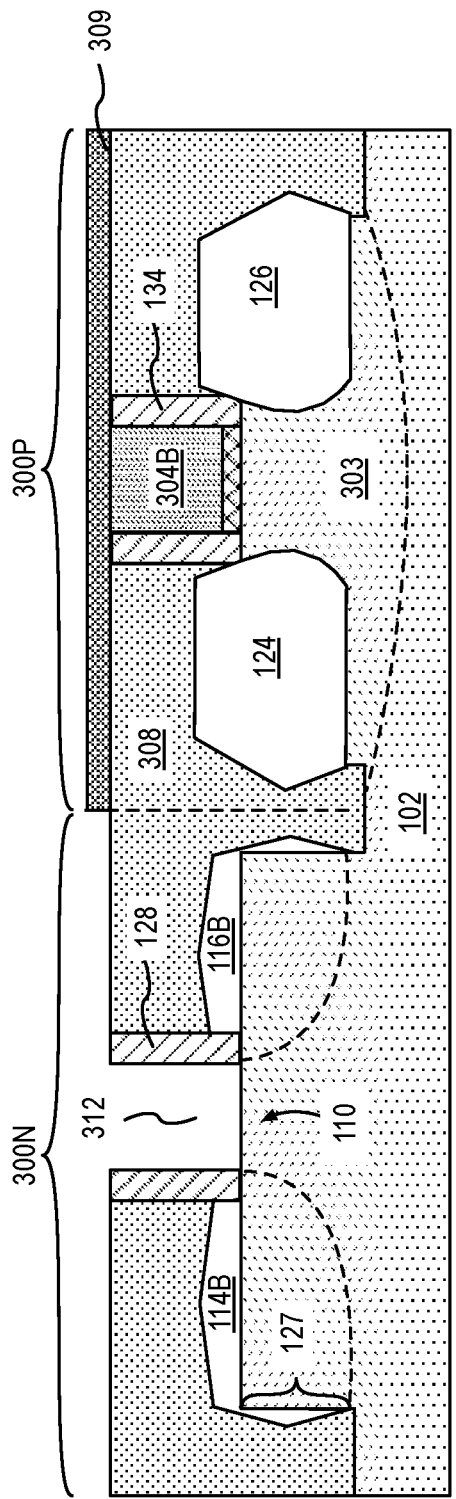
FIG. 3G is a cross-sectional illustration of the structure in FIG. 3F following removal of the first dummy gate structure to form an opening.

FIG. 3G is a cross-sectional illustration of the structure in FIG. 3F following removal of the dummy gate 304A and dummy gate dielectric layer 302A selectively to the dielectric spacer 128. In an embodiment, dummy gate 304A and dummy gate dielectric layer 302A are removed by a wet chemical process, a plasma etch or combination thereof. As shown, removal of the dummy gate 304A and the dummy gate dielectric layer 302A creates an opening 312.

Figure 3H:
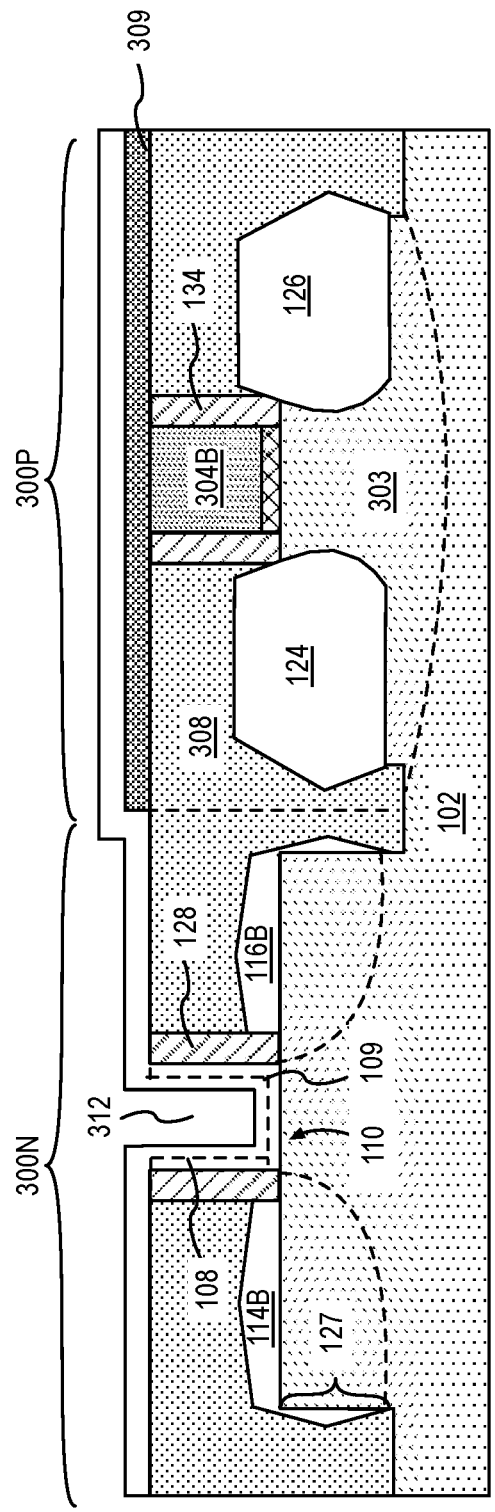
FIG. 3H illustrates the structure of FIG. 3G following a deposition of a first gate dielectric layer in the opening on a first channel layer.

FIG. 3H illustrates the structure of FIG. 3G following a deposition of a gate dielectric layer 108 into opening 312, on a top surface of substrate 102 within opening 312, on sidewalls of dielectric spacer 128 within opening 312, adjacent to dielectric spacer 128, and on a top or uppermost surface of the dielectric layer 308. As shown, the gate dielectric layer 108 is also deposited on the mask 312. In an embodiment, gate dielectric layer 108 is deposited by an atomic layer deposition process (ALD) process to ensure conformal deposition within the opening 312. A conformal deposition process, for example, may provide a film with a uniform thickness at an interface with the fin structure 127. Gate dielectric layer 108 may be deposited to a thickness in the range of 0.8 nm-1.3 nm depending on the material embodiment discussed above. A conformal deposition process, such as an atomic layer deposition (ALD) process is advantageous when depositing films that are in the order of 1 nm or less inside of an opening that ranges between 10 nm-15 nm. In an embodiment, an ALD process is utilized to deposit gate dielectric layer 108 including Hf and O, and in situ doping with Zr to form $Hf_{1-x}Zr_xO_2$, where $0.33<x<0.5$. In an embodiment, gate dielectric layer 108 is doped with one or more dopants such as Sr, Y or La during the deposition process. In some embodiments, prior to forming the gate dielectric layer 108, the deposition process includes forming a gate dielectric layer 109 (within dashed lines) on the channel 110. In embodiments, depositing the gate dielectric layer 109 includes co-flowing oxygen and one or more of aluminum, lanthanum or yttrium. In some embodiments, gate dielectric layer 109 is deposited to a thickness between 0.7 nm and 1 nm, and the gate dielectric layer 108 is deposited to a thickness of at least 1.3 nm.

In other embodiments, a physical vapor deposition process is utilized to deposit gate dielectric layer 108. In one such embodiment, gate dielectric layer 108 is amorphous as deposited on the substrate 102 and becomes crystalline after a thermal anneal process at process temperatures of at least 300 degrees Celsius.

In other embodiments, a gate dielectric layer including silicon and oxygen is grown on the channel layer 110 by a thermal oxidation process. The thickness of the gate dielectric layer can be controlled.

Figure 3I:
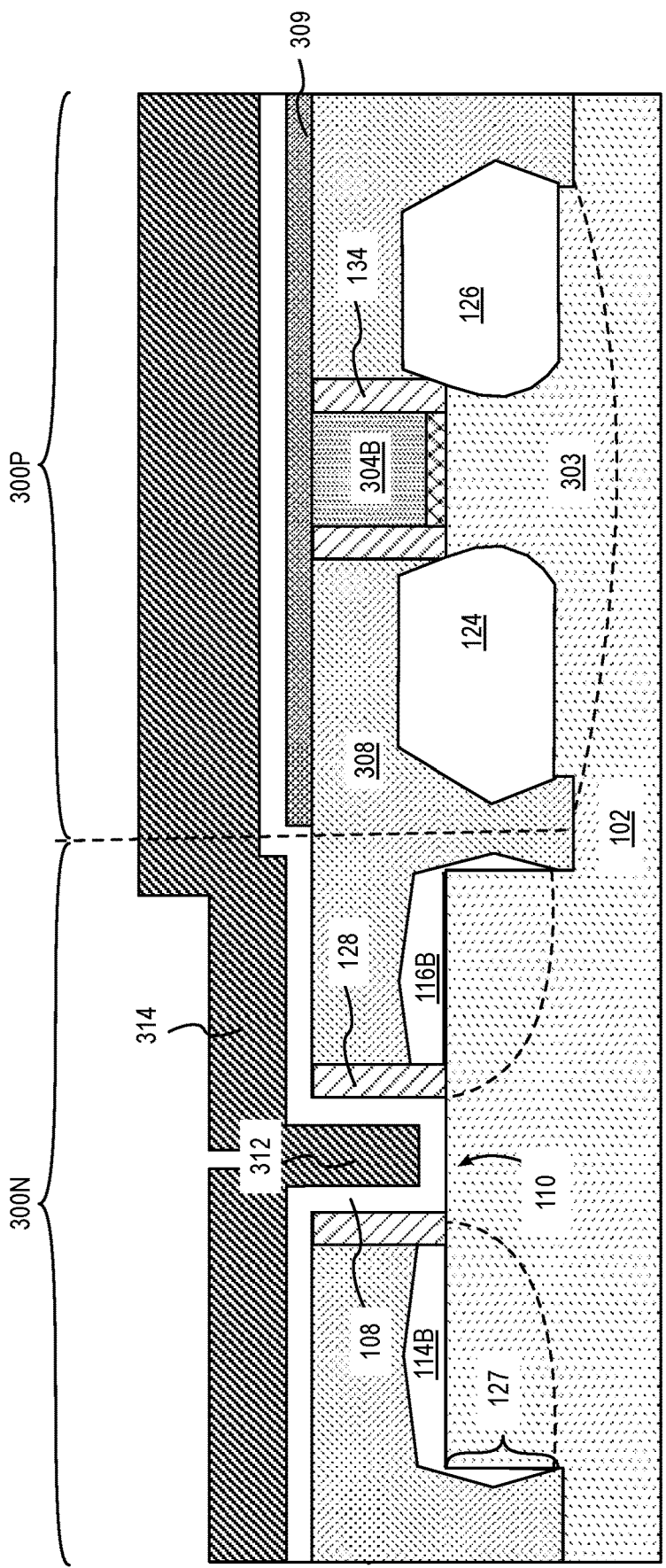
FIG. 3I is a cross-sectional illustration of the structure in FIG. 3H following the process to deposit a first gate electrode material in the opening and on the surface of the gate dielectric layer.

FIG. 3I is a cross-sectional illustration of the structure in FIG. 3H following the process to deposit a gate electrode material 314 in the opening 312 and on the surface of the gate dielectric layer 108. In an embodiment, the gate electrode material 314 includes the material of the gate electrode 112 described above. In an embodiment, the gate electrode material is deposited by an ALD process. In some embodiments, the gate electrode 314 includes a work function material deposited on the gate dielectric layer 108 and a fill material such as tungsten, tantalum or ruthenium on the work function material. In the illustrative embodiment, the gate electrode 314 is deposited to fabricate an NMOS transistor. The gate electrode material 314 is deposited to a thickness that can be planarized.

Figure 3J:
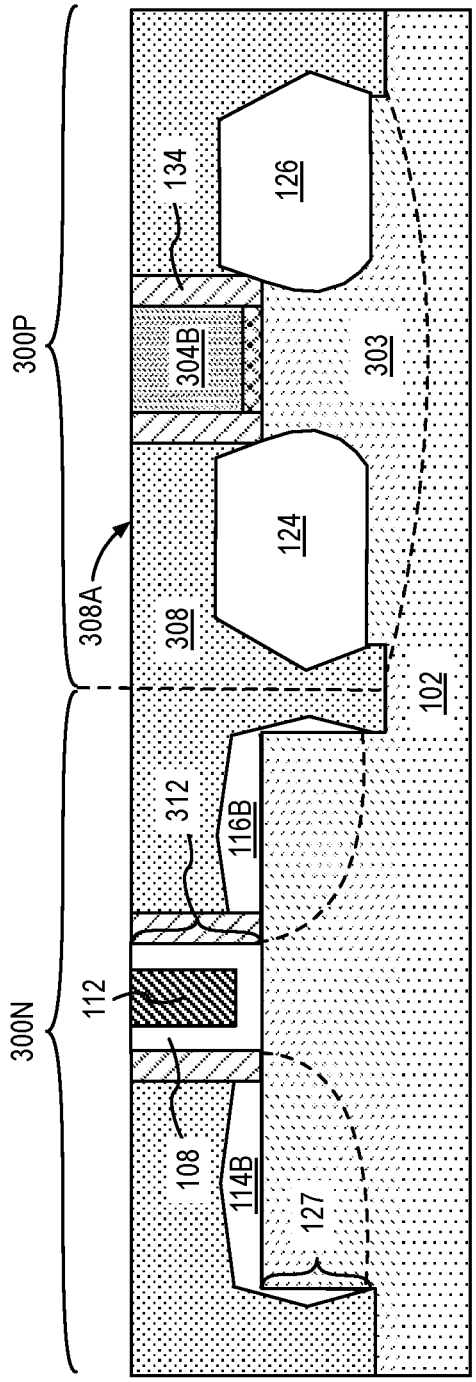
FIG. 3J illustrates the structure of FIG. 3I following a planarization process to form a first gate electrode and isolate the first gate dielectric layer adjacent to the gate electrode.

FIG. 3J illustrates the structure of FIG. 3I following a planarization process to form a gate electrode 112 and isolate gate dielectric layer 108 adjacent to the gate electrode 112. In an embodiment, the planarization process includes a chemical mechanical planarization (CMP) process. In an embodiment, the uppermost surfaces of the excess portions of gate electrode material 314 and excess portions of gate dielectric layer 108 away from the opening 312 are removed leaving the gate electrode 112 and gate dielectric layer 108 in the opening 312. In an embodiment, uppermost surfaces of gate electrode 112 and gate dielectric layer 108 are co-planar or substantially co-planar with the uppermost surface of dielectric layer 308A and top surface of dummy gate structure 304B. Co-planarity is advantageous to minimize height variation between adjacent transistors and also minimize any potential contact formation issues.

Figure 3K:
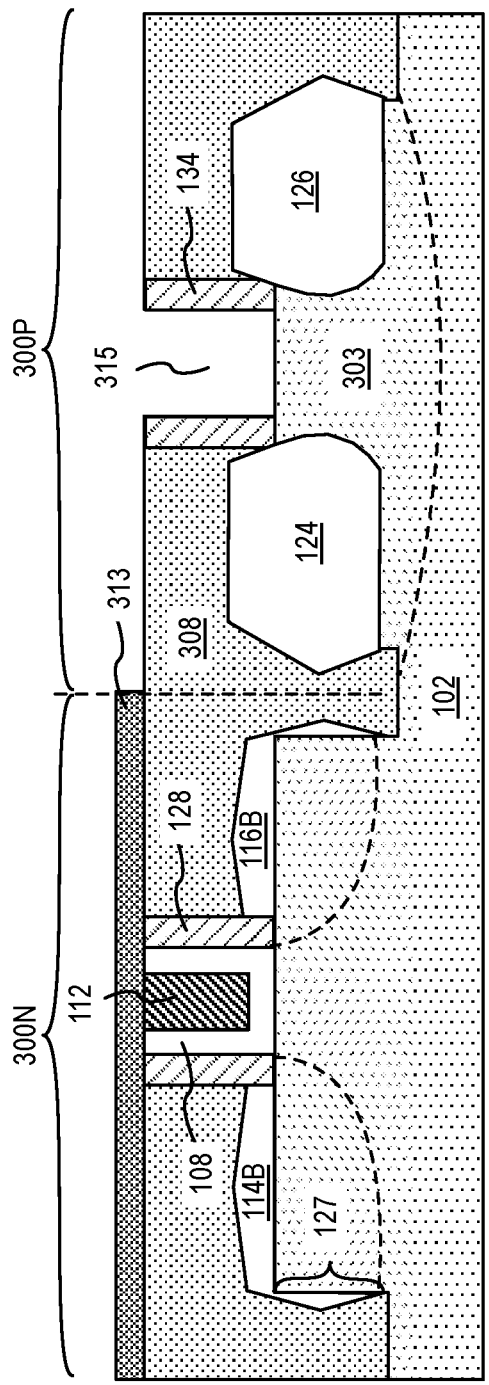
FIG. 3K is a cross-sectional illustration of the structure in FIG. 3J following the process to mask the NMOS region, in accordance with an embodiment of the present disclosure.

FIG. 3K is a cross-sectional illustration of the structure in FIG. 3J following the process to mask NMOS region 300N, in accordance with an embodiment of the present disclosure. In an embodiment, mask 313 includes silicon and one or more of oxygen, carbon or nitrogen. The mask 313 is formed on the dielectric 308 in the NMOS region 300N.

Following the formation of mask 313, the dummy gate 304B and dummy gate dielectric layer 302B are selectively removed with respect to the dielectric spacer 134 and dielectric 308. In an embodiment, dummy gate 304B and dummy gate dielectric layer 302B are removed by a wet chemical process, a plasma etch or combination thereof. As shown, removal of the dummy gate 304B and the dummy gate dielectric layer 302B creates an opening 315.

Figure 3L:
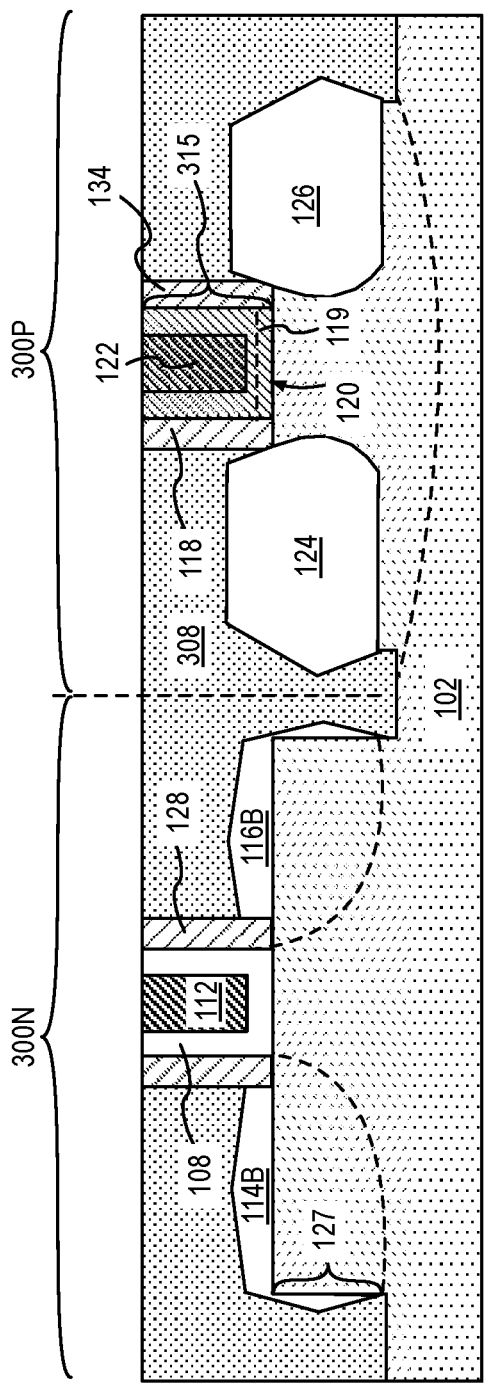
FIG. 3L is a cross-sectional illustration of the structure in FIG. 3K following the process to remove the second dummy gate structure and form a second gate dielectric layer and second gate electrode in the PMOS region on a second channel layer.

FIG. 3L is a cross-sectional illustration of the structure in FIG. 3K following the process to form gate dielectric layer 118 and gate electrode 122 in the PMOS region 300P. In an embodiment, the process operations utilized to form gate dielectric layer 118 and gate electrode 122 are substantially the same as the process operations utilized to form gate dielectric layer 108 and gate electrode 112. In an embodiment, an ALD process is utilized to deposit gate dielectric layer 118 including Hf and O, and in situ doping with Zr to form $Hf_{1-x}Zr_xO_2$, where $0.5<x<0.99$. In an embodiment, gate dielectric layer 118 is doped with one or more dopants such as Al or Nb during the deposition process. In some embodiments, prior to forming the gate dielectric layer 118, the deposition process includes forming a gate dielectric layer 119 (within dashed lines) on the channel 120 within n-well 303. In embodiments, depositing the gate dielectric layer 119 (dashed lines) includes thermally growing a silicon oxide film on the material of the channel layer 120. In some embodiments, after depositing the gate dielectric layer 118 and the gate electrode material, a scavenging process may be performed to thin down the silicon oxide film. In one such embodiment the scavenging process removes oxygen from an interface between the channel 120 and the gate dielectric layer 118.

In embodiments, gate dielectric layer 118 includes the material of the gate dielectric layer 118 described above and gate electrode 122 includes a material of the gate electrode 122, described above. In embodiments, the processing conditions and temperatures for forming gate dielectric layer 118 and gate electrode 122 are different from forming gate dielectric layer 108 and gate electrode 112, respectively. Such differences arise the different materials, dopants and crystallinity between gate dielectric layer 108 and gate dielectric layer 118, for example.

The gate dielectric layer 118 and gate electrode material are planarized after deposition to form gate electrode 122 in the opening 315.

Figure 3M:
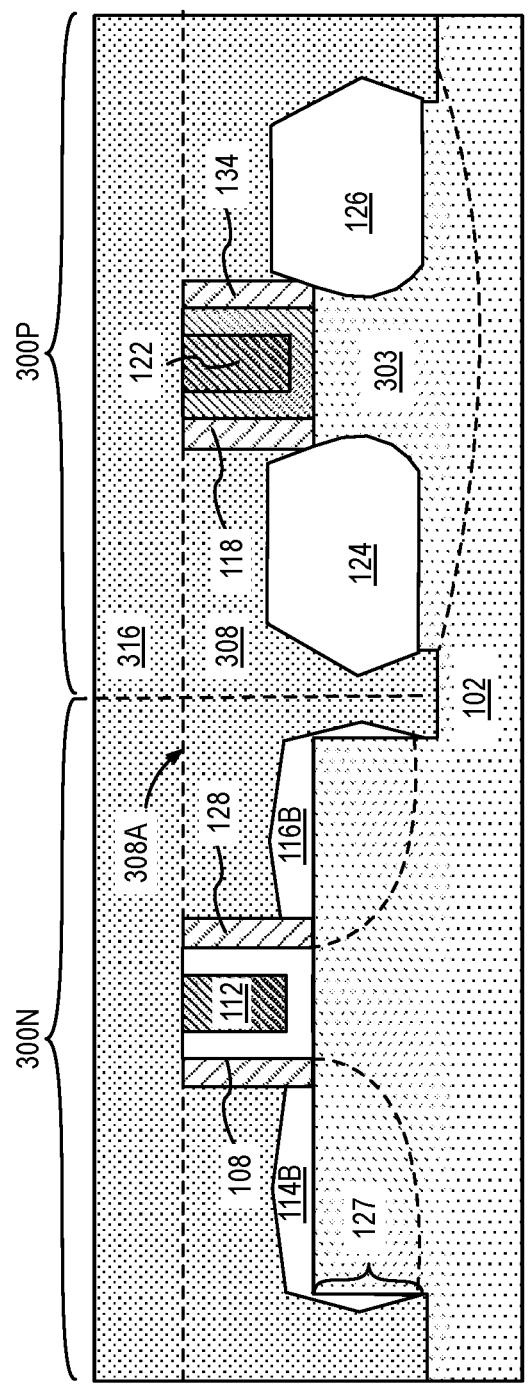
FIG. 3M illustrates the structure of FIG. 3L following the deposition of a second dielectric layer.

FIG. 3M illustrates the structure of FIG. 3L following the deposition of a dielectric layer 316 on uppermost surface 308A of dielectric layer 308, dielectric spacers 128 and 134, gate electrodes 112 and 122 and gate dielectric layers 108 and 118. In an embodiment, dielectric layer 316 includes a silicon dioxide, silicon nitride or carbon doped silicon oxide. In an embodiment, dielectric layer 316 includes a material that is the same or substantially the same as the material of the dielectric 308 and is blanket deposited using a PECVD or CVD process.

Figure 3N:
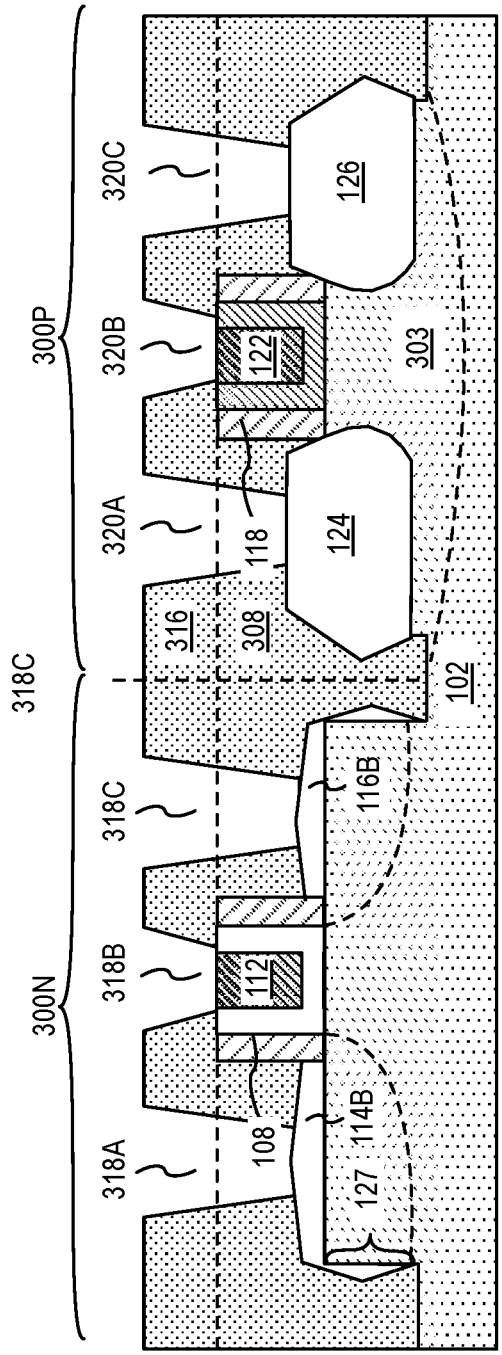
FIG. 3N is a cross-sectional illustration of the structure in FIG. 3M following the process to following the formation of openings in the second dielectric layer and in the first dielectric layer.

FIG. 3N is a cross-sectional illustration of the structure in FIG. 3M following the process to following the formation of openings 318A, 318B, 318C above source structure 114B, gate electrode 112 and drain structure 116B, respectively, and following the formation of openings 320A, 320B and 320C above epitaxial source structure 124, gate electrode 122 and epitaxial drain structure 126, respectively. In an embodiment, a photoresist mask (not shown) is patterned over the dielectric layer 316, where the pattern defines a location for openings to be formed relative to the source structure 114B, gate electrode 112, drain structure 116B, epitaxial source structure 124, gate electrode 122 and epitaxial drain structure 126. In one embodiment, a plasma etch process is utilized to form the openings 318A, 318B 318C, 320A, 320B and 320C in the dielectric layer 316, in the dielectric layer 308, respectively, selectively to the underlying source structure 114B, gate electrode 112, drain structure 116B, epitaxial source structure 124, gate electrode 122 and epitaxial drain structure 126 as shown in the cross-sectional illustration of FIG. 3N.

Figure 3O:
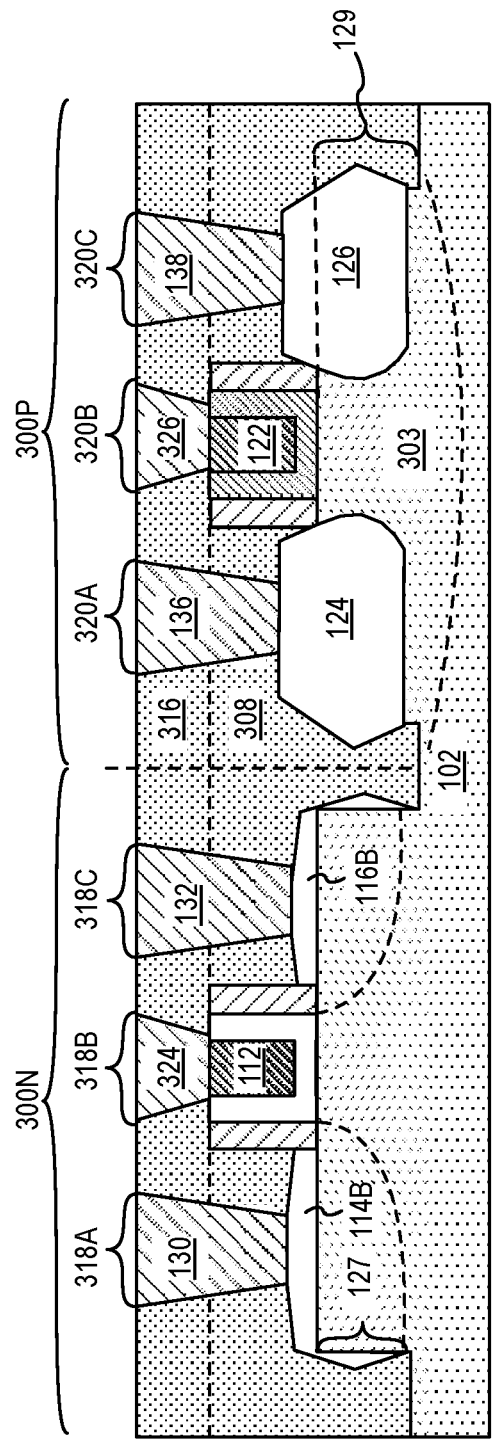
FIG. 3O is a cross-sectional illustration of the structure in FIG. 3N following the following the formation of source and drain contacts on the source and drain regions, respectively in the NMOS region and in the PMOS region and following the formation of gate contact on the first gate electrode and a gate contact on the second gate electrode.

FIG. 3O is a cross-sectional illustration of the structure in FIG. 3N following the following the formation of a source contact 130, gate contact 324, and a drain contact 132 on source structure 114B, gate electrode 112 and on drain structure 116B, respectively, and the formation of source contact 136, gate contact 326, and a drain contact 138 on epitaxial source structure 124, gate electrode 122 and on epitaxial drain structure 126, respectively.

In an embodiment, one or more layers of contact metal are deposited inside each of openings 318A, 318B, 318C, 320A, 320B and 320C and on exposed surfaces of source structure 114B, gate electrode 112, drain structure 116B, epitaxial source structure 124, gate electrode 122 and on epitaxial drain structure 126, respectively. In the illustrative embodiment, the one or more layers of the contact metal are also blanket deposited on the uppermost surface and on sidewalls of dielectric layer 316. In an embodiment, the one or more layers of contact material are deposited using a plasma enhanced chemical vapor deposition (PECVD) or an ALD process. In an embodiment, the as deposited one or more layers of contact material include one or more layers of the source contact 130 described in association with FIG. 1A.

Referring again to FIG. 3O, a planarization process is then carried out to remove the one or more layers of contact material from the uppermost surface of the dielectric layer 316. In one embodiment, the planarization process includes a chemical mechanical polish (CMP) process. The CMP process removes all of the one or more layers of contact material from the uppermost surfaces of dielectric layer 316. The CMP process leaves the one or more layers of contact material in the openings 318A, 318B, 318C, 320A, 320B and 320C to form source contact 130, gate contact 324, drain contact 132, source contact 136, gate contact 326, and drain contact 138, respectively, as shown.

FIG. 4A illustrates a cross-sectional view of a system 400 including a CMOS transistor 100A and non-volatile memory element 402A, and 402B coupled to the drain contact 132 and 138, respectively of the CMOS transistor 100A, in accordance with an embodiment of the present disclosure.

Non-volatile memory elements 402A and 402B are substantially identical and may include a magnetic tunnel junction (MTJ) device, a conductive bridge random access memory (CBRAM) device, or a resistive random-access memory (RRAM) device.

FIG. 4B illustrates a cross-sectional view of an example non-volatile memory element 402A, 402B that includes a magnetic tunnel junction (MTJ) material device. In the illustrated embodiment, the MTJ device includes a bottom electrode 404, a fixed magnet 406 above the bottom electrode 404, a tunnel barrier 408 on the fixed magnet 406, a free magnet 410 on the tunnel barrier 408, and a top electrode 412 on the free magnet 410. In an embodiment, a dielectric spacer laterally surrounds (not shown) non-volatile memory element 402.

In an embodiment, fixed magnet 406 includes a material and has a thickness sufficient for maintaining a fixed magnetization. For example, fixed magnet 406 may include an alloy such as CoFe and CoFeB. In an embodiment, fixed magnet 406 includes $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, fixed magnet 406 is FeB, where the concentration of boron is between 10 and 40 atomic percent of the total composition of the FeB alloy. In an embodiment, the fixed magnet 406 has a thickness that is between 1 nm and 2.5 nm.

In an embodiment, tunnel barrier 408 is composed of a material suitable for allowing electron current having a majority spin to pass through tunnel barrier 408, while impeding, at least to some extent, electron current having a minority spin from passing through tunnel barrier 408. Thus, tunnel barrier 408 (or spin filter layer) may also be referred to as a tunneling layer for electron current of a particular spin orientation. In an embodiment, tunnel barrier 408 includes a material such as, but not limited to, magnesium oxide (MgO) or aluminum oxide ($Al_2O_4$). In an embodiment, tunnel barrier 408 including MgO has a crystal orientation that is (001) and is lattice matched to free magnet 410 above tunnel barrier 408 and fixed magnet 406 below tunnel barrier 408. In an embodiment, tunnel barrier 408 is MgO and has a thickness is between 1 nm to 2 nm.

In an embodiment, free magnet 410 includes a magnetic material such as Co, Ni, Fe or alloys of these materials. In an embodiment, free magnet 410 includes a magnetic material such as FeB, CoFe and CoFeB. In an embodiment, free magnet 410 includes a $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, free magnet 410 is FeB, where the concentration of boron is between 10 and 40 atomic percent of the total composition of the FeB alloy. In an embodiment, free magnet 410 has a thickness that is between 1 nm and 2.0 nm.

In an embodiment, bottom electrode 404 includes an amorphous conductive layer. In an embodiment, bottom electrode 404 is a topographically smooth electrode. In an embodiment, bottom electrode 404 includes a material such as W, Ta, TaN or TiN. In an embodiment, bottom electrode 404 is composed of Ru layers interleaved with Ta layers. In an embodiment, bottom electrode 404 has a thickness between 20 nm and 50 nm. In an embodiment, top electrode 412 includes a material such as W, Ta, TaN or TiN. In an embodiment, top electrode 412 has a thickness between 30 nm and 70 nm. In an embodiment, bottom electrode 404 and top electrode 412 are the same metal such as Ta or TiN. In an embodiment, the MTJ device has a combined total thickness of the individual layers is between 60 nm and 100 nm and a thickness is between 10 nm and 50 nm.

Referring again to FIG. 4A, in an embodiment, non-volatile memory element 402A and 402B are representative of a resistive random access memory (RRAM) device that operates on a principle of filamentary conduction. When an RRAM device undergoes an initial voltage breakdown, a filament is formed in a layer known as a switching layer.

FIG. 4C illustrates a cross-sectional view of an example non-volatile memory element 402 that includes a resistive random-access memory (RRAM) device. In the illustrated embodiment, the RRAM material stack includes a bottom electrode 414, a switching layer 416 over the bottom electrode 414, an oxygen exchange layer 418 over the switching layer 416, and a top electrode 420 on the oxygen exchange layer 418.

In an embodiment, bottom electrode 414 includes an amorphous conductive layer. In an embodiment, bottom electrode 414 is a topographically smooth electrode. In an embodiment, bottom electrode 414 includes a material such as W, Ta, TaN or TiN. In an embodiment, bottom electrode 414 is composed of Ru layers interleaved with Ta layers. In an embodiment, bottom electrode 414 has a thickness is between 20 nm and 50 nm. In an embodiment, top electrode 420 includes a material such as W, Ta, TaN or TiN. In an embodiment, top electrode 420 has a thickness is between 4 nm and 70 nm. In an embodiment, bottom electrode 414 and top electrode 420 are the same metal such as Ta or TiN.

Switching layer 416 may be a metal oxide, for example, including oxygen and atoms of one or more metals, such as, but not limited to Hf, Zr, Ti, Ta or W. In the case of titanium or hafnium, or tantalum with an oxidation state +4, switching layer 416 has a chemical composition, $MO_X$, where O is oxygen and X is or is substantially close to 2. In the case of tantalum with an oxidation state +5, switching layer 416 has a chemical composition, $M_2O_X$, where O is oxygen and X is or is substantially close to 5. In an embodiment, switching layer 416 has a thickness is between 1 nm and 5 nm.

Oxygen exchange layer 418 acts as a source of oxygen vacancy or as a sink for $O^{2-}$. In an embodiment, oxygen exchange layer 418 is composed of a metal such as but not limited to, hafnium, tantalum or titanium. In an embodiment, oxygen exchange layer 418 has a thickness is between 5 nm and 20 nm. In an embodiment, the thickness of oxygen exchange layer 418 is at least twice the thickness of switching layer 416. In another embodiment, the thickness of oxygen exchange layer 418 is at least twice the thickness of switching layer 416. In an embodiment, the RRAM device has a combined total thickness of the individual layers is between 60 nm and 100 nm and thickness is between 10 nm and 50 nm.

Referring again to FIG. 4A, the memory device 402A is coupled to the transistor 104A through drain contact 132. In an embodiment, there are one or more levels of interconnects between drain contact 132 and non-volatile memory element 402A. The system 400 further includes a source interconnect 426 coupled with the source contact 130 and gate interconnect 428 coupled with the gate contact 324. The memory device 402A is further coupled to a memory interconnect 430A.

In the illustrative embodiment, memory device 402B is coupled to transistor 106A through drain contact 138. In an embodiment, there are one or more levels of interconnects between drain contact 138 and non-volatile memory element 402B. The system 400 further includes a source interconnect 432 coupled with the source contact 136 and gate interconnect 434 coupled with the gate contact 326. The memory device 402B is further coupled to a memory interconnect 430B.

In an embodiment, source interconnects 426 and 432, gate interconnects 428 and 434 and memory interconnects 430A and 430B are embedded in a dielectric layer 436. In an embodiment, source interconnects 426 and 432, gate interconnects 428 and 434 and memory interconnects 430A and 430B each include titanium, tantalum, tungsten, ruthenium, copper, or nitrides of titanium, tantalum, tungsten, ruthenium. In an embodiment, source interconnects 426 and 432, gate interconnects 428 and 434 and memory interconnects 430A and 430B include a liner layer including ruthenium or tantalum and a fill metal such as copper or tungsten. In embodiments, dielectric 436 includes silicon and one or more of nitrogen, oxygen and carbon such as, silicon nitride, silicon dioxide, carbon doped silicon nitride, silicon oxynitride or silicon carbide.

Figure 5:
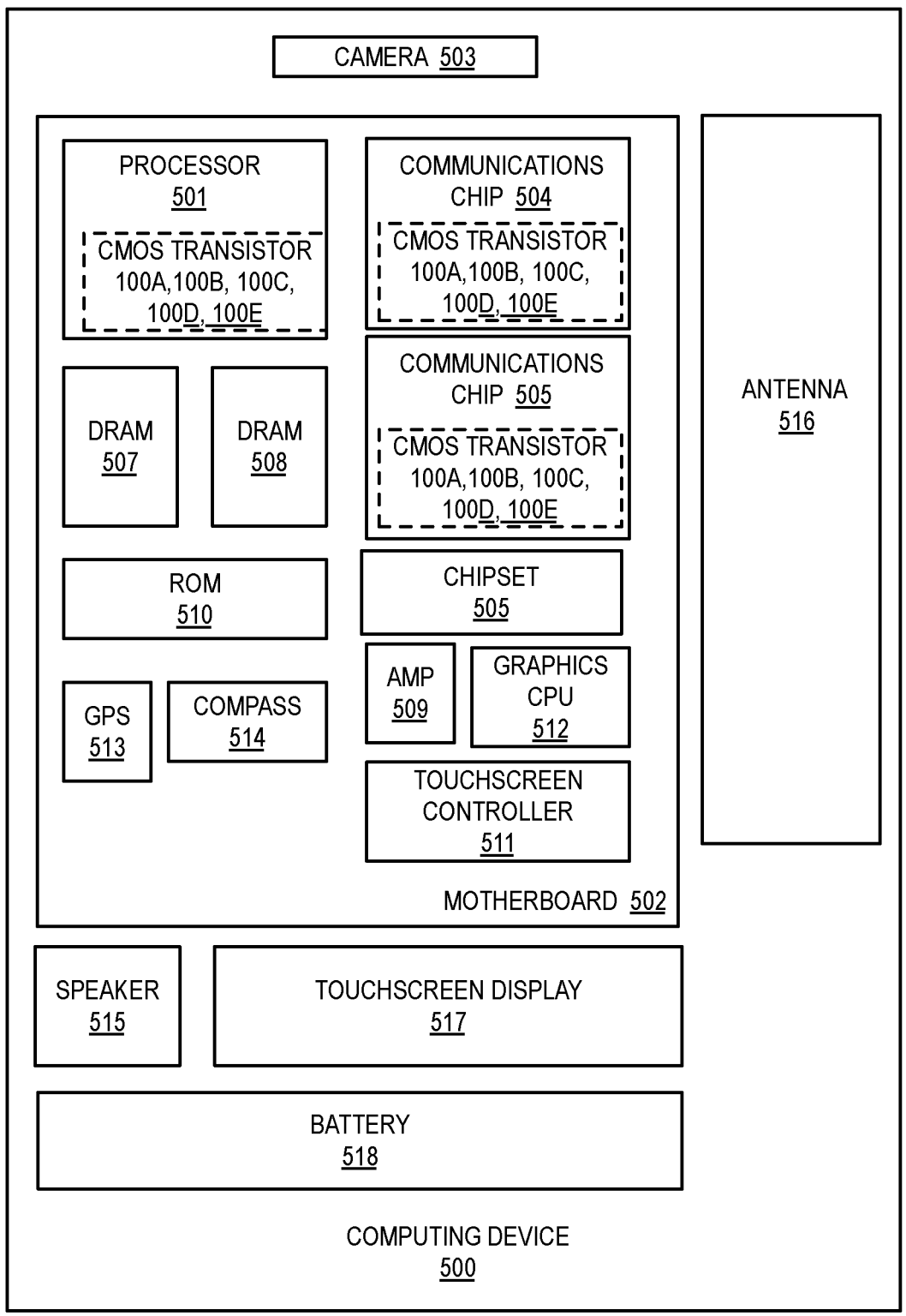
FIG. 5 illustrates a computing device in accordance with embodiments of the present disclosure.

FIG. 5 illustrates a computing device 500 in accordance with embodiments of the present disclosure. As shown, computing device 500 houses a motherboard 502. Motherboard 502 may include a number of components, including but not limited to a processor 501 and at least one communications chip 504 or 505. Processor 501 is physically and electrically coupled to the motherboard 502. In some implementations, communications chip 505 is also physically and electrically coupled to motherboard 502. In further implementations, communications chip 505 is part of processor 501.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset 506, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 505 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 505 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communications chips 504 and 505. For instance, a first communications chip 505 may be dedicated to shorter range wireless communications such as Wi-Fi and Bluetooth and a second communications chip 504 may be dedicated to longer range wireless communications such as GPS, EDGE, GPRS, CDMA, WiMAX, LTE, Ev-DO, and others.

Processor 501 of the computing device 500 includes an integrated circuit die packaged within processor 501. In some embodiments, the integrated circuit die of processor 501 includes one or more CMOS transistors 100A, 100B, 100C, 100D or 100E including different high-K gate dielectric layers for NMOS and PMOS transistors. The term "processor" may refer to any device or portion of a device that processes electronic data from registers and/or memory to transform that electronic data into other electronic data that may be stored in registers and/or memory.

Communications chip 505 also includes an integrated circuit die packaged within communication chip 505. In another embodiment, the integrated circuit die of communications chips 504, 505 includes one or more one or more CMOS transistors 100A, 100B, 100C, 100D or 100E including different high-K gate dielectric layers for NMOS and PMOS transistors. Depending on its applications, computing device 500 may include other components that may or may not be physically and electrically coupled to motherboard 502. These other components may include, but are not limited to, volatile memory (e.g., DRAM) 507, 508, non-volatile memory (e.g., ROM) 510, a graphics CPU 512, flash memory, global positioning system (GPS) device 513, compass 514, a chipset 506, an antenna 516, a power amplifier 509, a touchscreen controller 511, a touchscreen display 517, a speaker 515, a camera 503, and a battery 518, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 500 and discussed above may contain a stand-alone integrated circuit memory die that includes one or more arrays of NVM devices.

In various implementations, the computing device 500 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
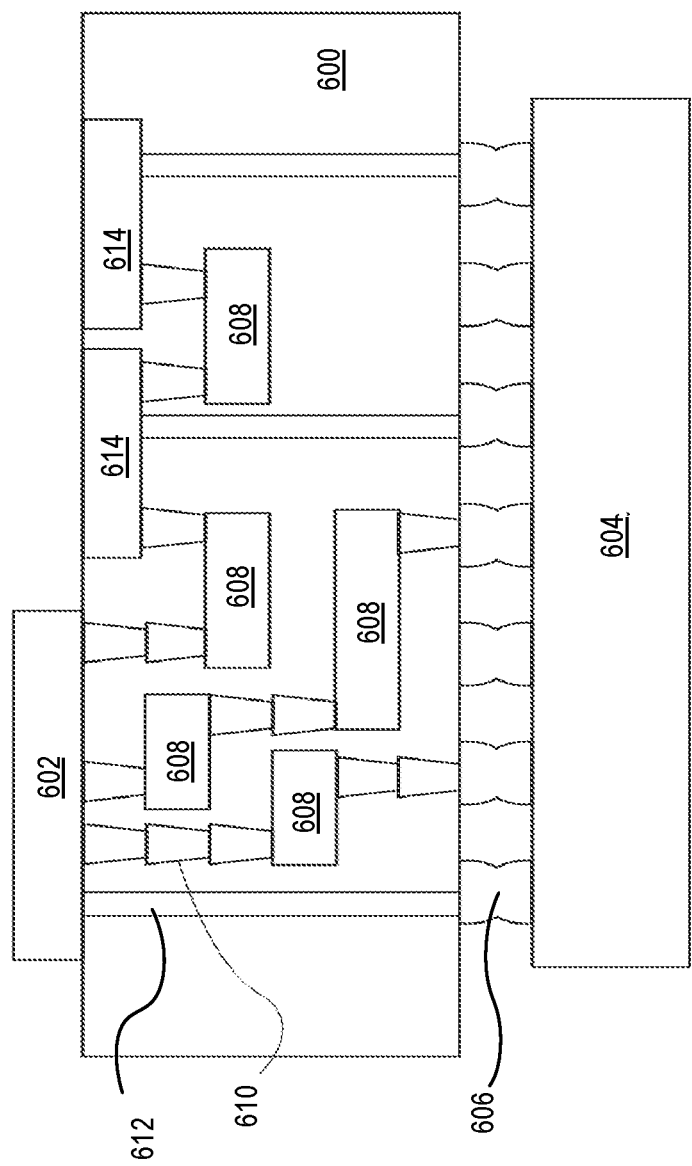
FIG. 6 illustrates an integrated circuit (IC) structure that includes one or more embodiments of the present disclosure.

FIG. 6 illustrates an integrated circuit (IC) structure 600 that includes one or more embodiments of the disclosure. The integrated circuit (IC) structure 600 is an intervening substrate used to bridge a first substrate 602 to a second substrate 604. The first substrate 602 may be, for instance, an integrated circuit die. The second substrate 604 may be, for instance, a memory module, a computer mother, or another integrated circuit die. Generally, the purpose of an integrated circuit (IC) structure 600 is to spread a connection to a wider pitch or to reroute a connection to a different connection. For example, an integrated circuit (IC) structure 600 may couple an integrated circuit die to a ball grid array (BGA) 607 that can subsequently be coupled to the second substrate 604. In some embodiments, the first substrate 602 and the second substrate 604 are attached to opposing sides of the integrated circuit (IC) structure 600. In other embodiments, the first substrate 602 and the second substrate 604 are attached to the same side of the integrated circuit (IC) structure 600. And in further embodiments, three or more substrates are interconnected by way of the integrated circuit (IC) structure 600.

The integrated circuit (IC) structure 600 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 608 and vias 610, including but not limited to through-silicon vias (TSVs) 612. The integrated circuit (IC) structure 600 may further include embedded devices 614, including both passive and active devices. Such embedded devices 614 include capacitors, decoupling capacitors, resistors, inductors, fuses, diodes, transformers, one or more one or more CMOS transistors 100A, 100B, 100C, 100D or 100E including different high-K gate dielectric layers for NMOS and PMOS transistors, as illustrated in FIGS. 1A-1E. Referring again to FIG. 6, the integrated circuit (IC) structure 600 may further include embedded devices 614 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 600.

Thus, one or more embodiments of the present disclosure relate to integrated circuit structure such as CMOS transistors 100A, 100B, 100C, 100D or 100E, as described above.

In a first example, a complementary metal oxide semiconductor (CMOS) transistor, includes a first transistor including a first gate dielectric layer above a first channel, where the first gate dielectric layer includes $Hf_{1-x}Zr_xO_2$, where $0.33<x<0.5$. The first transistor further includes a first gate electrode on the first gate dielectric layer and a first source region and a first drain region on opposite sides of the first gate electrode. The CMOS transistor further includes a second transistor adjacent to the first transistor. The second transistor includes a second gate dielectric layer above a second channel, where the second gate dielectric layer includes $Hf_{1-x}Zr_xO_2$, where $0.5<x<0.99$, a second gate electrode on the second gate dielectric layer and a second source region and a second drain region on opposite sides of the second gate electrode.

In second examples, for any of first example, the first gate dielectric layer includes a first dopant, and the second gate dielectric layer includes a second dopant.

In third examples, for any of the first through second examples, the first dopant includes one of La, Y or Sr having a concentration of less than 5 atomic percent.

In fourth examples, for any of the first through third examples, the second dopant includes Al or Nb having a concentration of less than 5 atomic percent.

In fifth examples, for any of the first through fourth examples, the first dielectric has a first thickness, and the second dielectric has a second thickness where the first thickness is greater than the second thickness by 0.2 nm.

In sixth examples, for any of the first through fifth examples, the first gate dielectric layer includes a monoclinic crystal structure, and the second gate dielectric layer includes an orthorhombic or a tetragonal crystal structure.

In seventh examples, for any of the first through sixth examples, the first gate electrode includes one or more of hafnium, zirconium, titanium, tantalum, aluminum, or carbon, or carbon and one or more of hafnium, zirconium, titanium, tantalum, aluminum, and where the second gate electrode includes ruthenium, palladium, platinum, cobalt, nickel or titanium nitride.

In eighth examples, for any of the first through seventh examples, the first transistor further includes a third gate dielectric including silicon and oxygen between the first gate dielectric layer and the first channel and the second transistor further includes a fourth gate dielectric including silicon and oxygen between the second gate dielectric layer and the second channel, where the third gate dielectric layer has a thickness that is greater than a thickness of the fourth gate dielectric layer by at least 0.1 nm.

In ninth examples, for any of the first through eighth examples, the first transistor further includes a fifth gate dielectric including oxygen and one or more of aluminum, lanthanum or yttrium, between the first gate dielectric layer and the channel, where in the fifth gate dielectric layer has a thickness that is between 0.7 nm and 1 nm, and the first gate dielectric layer has a thickness of at least 1.3 nm.

In tenth examples, for any of the first through ninth examples, the first transistor further includes a first dielectric spacer adjacent to the first gate electrode, and wherein the first gate dielectric layer is adjacent to sidewalls of the first dielectric spacer, the second transistor further includes a second dielectric spacer adjacent to the second gate electrode, and wherein the second gate dielectric layer is adjacent to sidewalls of the second dielectric spacer.

In eleventh examples, a complementary metal oxide semiconductor (CMOS) transistor, includes a first transistor including a first gate dielectric layer above a first channel, where the first gate dielectric layer includes $Hf_{1-x}Zr_xO_2$, where $0.33<x<0.5$, and a first dopant. The first transistor further includes a first gate electrode on the first gate dielectric layer and a first source region and a first drain region on opposite sides of the first gate electrode. The CMOS transistor further includes a second transistor adjacent to the first transistor. The second transistor includes a second gate dielectric layer above a second channel, where the second gate dielectric layer includes $Hf_{1-x}Zr_xO_2$, where $0.5<x<0.99$, a second gate electrode on the second gate dielectric layer and a second source region and a second drain region on opposite sides of the second gate electrode. The system further includes a first memory element above and coupled with the first drain region, and a second memory element above and coupled with the second drain region.

In twelfth examples, for any of the eleventh example, the first gate dielectric layer includes a first dopant, and the second gate dielectric layer includes a second dopant, where the first dopant includes one of La, Y or Sr having a concentration of less than 5 atomic percent, and where the second dopant includes Al or Nb having a concentration of less than 5 atomic percent.

In thirteenth examples, for any of the eleventh through twelfth examples, the first dielectric has a first thickness and the second dielectric has a second thickness where the first thickness is greater than the second thickness by 0.2 nm.

In a fourteenth example, for any of the eleventh through thirteenth examples, each of the first memory element and the second memory element includes a resistive random-access memory (RRAM) element above the drain contact. the RRAM element includes a bottom electrode, a switching layer above the bottom electrode, wherein the switching layer has a chemical composition, $MO_{2-X}$, where M is a metal and O is an oxide, where X is approximately in the range from 0 to 0.05 and a top electrode above the switching layer.

In fifteenth examples, for any of the eleventh through fourteenth examples, each of the first memory element and the second memory element includes a magnetic tunnel junction (MTJ) device above the drain contact. The MTJ device includes a fixed magnet, a tunnel barrier above the fixed magnet and a free magnet above the tunnel barrier.

In sixteenth examples, for any of the eleventh through fifteenth examples, the system further includes a battery and an antenna coupled with the system.

In seventeenth examples, a method of fabricating a semiconductor structure. The method includes patterning a substrate to form a first channel over an n-region and a second channel over a p-region and forming a first dummy gate over the first channel and a second dummy gate over the second channel. The method further includes forming a first pair of doped source and doped drain regions on opposite sides of the first dummy gate, and a second pair of doped source and doped drain regions on opposite sides of the second dummy gate. The method further includes forming a dielectric adjacent the first dummy gate and the second dummy gate and removing the first gate selectively to the second gate to form a first opening and forming a first gate dielectric layer and a first gate electrode in the first opening. The method further includes removing the second dummy gate selectively to the first gate electrode and first gate dielectric layer to form a second opening and forming a second gate dielectric layer and a second gate electrode in the second opening.

In eighteenth examples, for any of the seventeenth example, wherein forming the first gate dielectric layer comprises depositing a first layer comprising Hf and O, and in situ doping the first gate dielectric layer with Zr to form $Hf_{1-x}Zr_xO_2$, where $0.33<x<0.5$, wherein forming the second gate dielectric layer comprises depositing a second layer comprising Hf and O, and in situ doping the second gate dielectric layer with Zr to form $Hf_{1-x}Zr_xO_2$, where $0.5<x<0.99$.

In nineteenth examples, for any of the seventeenth through eighteenth examples, prior to forming the first gate dielectric layer, the method further comprises depositing a second layer on the first channel, wherein depositing the second layer comprises co-flowing oxygen and one or more of aluminum, lanthanum or yttrium, In twentieth example, for any of the seventeenth through nineteenth examples, forming the second gate electrode includes scavenging oxygen from an interface between the second channel and the second gate dielectric layer.

What is claimed is:

1. A complementary metal oxide semiconductor (CMOS) structure, comprising:
   a first transistor comprising:
      a first gate dielectric layer above a first channel, the first gate dielectric layer comprising $Hf_{1-x}Zr_xO_2$, wherein the first gate dielectric layer has a thickness of at least 1.3 nm;
      a first gate electrode coupled to the first channel through the first gate dielectric layer;
      a gate dielectric layer comprising oxygen and one or more of aluminum, lanthanum or yttrium located between the first gate dielectric layer and the channel and having a thickness between 0.7 nm and 1 nm; and
      a first source region and a first drain region of a first conductivity type on opposite sides of the first gate electrode; and
   a second transistor comprising:
      a second gate dielectric layer above a second channel, the second gate dielectric layer comprising $Hf_{1-x}Zr_xO_2$, wherein x for the second gate dielectric layer is greater than x for the first gate dielectric layer;
      a second gate electrode coupled to the second channel through the second gate dielectric layer; and
      a second source region and a second drain region of a second, complementary, conductivity type on opposite sides of the second gate electrode.

2. The CMOS structure of claim 1, wherein x for the first gate dielectric layer is less than 0.5.

3. The CMOS structure of claim 1, wherein the first gate dielectric layer comprises La, Y or Sr at a concentration of less than 5 atomic percent.

4. The CMOS structure of claim 1, wherein the second gate dielectric layer comprises Al or Nb at a concentration of less than 5 atomic percent.

5. The CMOS structure of claim 1, wherein the first dielectric layer is a first thickness and the second dielectric layer is a second thickness, and wherein the first thickness is greater than the second thickness by at least 0.2 nm.

6. The CMOS structure of claim 1, wherein the first gate dielectric layer comprises a monoclinic crystal structure and the second gate dielectric layer comprises an orthorhombic or a tetragonal crystal structure.

7. The CMOS structure of claim 1, wherein the first gate electrode comprises hafnium, zirconium, titanium, tantalum, aluminum, or carbon, and wherein the second gate electrode comprises ruthenium, palladium, platinum, cobalt, nickel or titanium nitride.

8. The CMOS structure of claim 1, wherein the first transistor further comprises a third gate dielectric layer comprising silicon and oxygen between the first gate dielectric layer and the first channel and the second transistor further comprises a fourth gate dielectric layer comprising silicon and oxygen between the second gate dielectric layer and the second channel, wherein the third gate dielectric layer has a thickness that is greater than a thickness of the fourth gate dielectric layer by at least 0.1 nm.

9. The CMOS structure of claim 1, wherein the first transistor further comprises a first dielectric spacer adjacent to the first gate electrode, and wherein the first gate dielectric layer is adjacent to sidewalls of the first dielectric spacer, the second transistor further comprises a second dielectric spacer adjacent to the second gate electrode, and wherein the second gate dielectric layer is adjacent to sidewalls of the second dielectric spacer.

10. A complementary metal oxide semiconductor (CMOS) structure, comprising:
   an NMOS transistor, comprising:
      a first gate dielectric layer above a first channel, the first gate dielectric layer comprising Hf, Zr, and O;
      a first gate electrode coupled to the first channel through the first gate dielectric layer; and
      a first source region and a first drain region on opposite sides of the first gate electrode; and
   a PMOS transistor, comprising:
      a second gate dielectric layer above a second channel, the second gate dielectric layer comprising Hf, Zr, and O, and wherein second gate dielectric layer has greater Zr content than the first gate dielectric layer;
      a second gate electrode coupled to the second channel through the second gate dielectric layer; and
      a second source region and a second drain region on opposite sides of the second gate electrode.

11. The CMOS structure of claim 10, wherein the second gate dielectric layer comprises $Hf_{1-x}$ and $Zr_x$, and wherein x is greater than 0.5.

12. The CMOS structure of claim 11, wherein the first gate dielectric layer comprises $Hf_{1-x}$ and $Zr_x$, and wherein x for the first gate dielectric layer is less than 0.5.

13. The CMOS structure of claim 12, wherein the first gate dielectric layer comprises La, Y or Sr at a concentration of less than 5 atomic percent, and wherein the second gate dielectric layer comprises Al or Nb at a concentration of less than 5 atomic percent.

* * * * *